United States Patent
Chen et al.

(10) Patent No.: US 10,269,921 B2
(45) Date of Patent: Apr. 23, 2019

(54) FIN FIELD EFFECT TRANSISTORS HAVING CONFORMAL OXIDE LAYERS AND METHODS OF FORMING SAME

(71) Applicant: Taiwan Semiconductor Manufacturing Company, Ltd., Hsin-Chu (TW)

(72) Inventors: Chia-Cheng Chen, Hsin-Chu (TW); Liang-Yin Chen, Hsin-Chu (TW); Xiong-Fei Yu, Hsin-Chu (TW); Syun-Ming Jang, Hsin-Chu (TW); Hui-Cheng Chang, Hsin-Chu (TW); Meng-Shu Lin, Hsin-Chu (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 9 days.

(21) Appl. No.: 15/357,675

(22) Filed: Nov. 21, 2016

(65) Prior Publication Data
US 2018/0145143 A1 May 24, 2018

Related U.S. Application Data

(62) Division of application No. 14/579,955, filed on Dec. 22, 2014, now Pat. No. 9,515,188.

(51) Int. Cl.
*H01L 29/51* (2006.01)
*H01L 21/8234* (2006.01)
(Continued)

(52) U.S. Cl.
CPC ...... *H01L 29/518* (2013.01); *H01L 21/28202* (2013.01); *H01L 21/823431* (2013.01);
(Continued)

(58) Field of Classification Search
CPC .......... H01L 29/42368; H01L 21/0223; H01L 29/7856; H01L 27/0886; H01L 29/513; H01L 21/823462; H01L 21/823431; H01L 29/518; H01L 21/02247; H01L 29/0847; H01L 29/1608; H01L 29/41775; H01L 29/42364; H01L 29/66545; H01L 29/7813; H01L 29/7851; H01L 29/6654; H01L 29/0657
See application file for complete search history.

(56) References Cited

U.S. PATENT DOCUMENTS 6,355,561 B1  3/2002 Sandhu et al.
6,358,867 B1  3/2002 Tews et al.
(Continued)

FOREIGN PATENT DOCUMENTS

EP    1124258 A3    7/2006

*Primary Examiner* — Thanh Y. Tran
(74) *Attorney, Agent, or Firm* — Slater Matsil, LLP

(57) ABSTRACT

An embodiment fin field-effect-transistor (finFET) includes a semiconductor fin comprising a channel region and a gate oxide on a sidewall and a top surface of the channel region. The gate oxide includes a thinnest portion having a first thickness and a thickest portion having a second thickness different than the first thickness. A difference between the first thickness and the second thickness is less than a maximum thickness variation, and the maximum thickness variation is in accordance with an operating voltage of the finFET.

20 Claims, 28 Drawing Sheets

(51) Int. Cl.
*H01L 27/088* (2006.01)
*H01L 29/78* (2006.01)
*H01L 21/28* (2006.01)
*H01L 29/66* (2006.01)
*H01L 29/165* (2006.01)

(52) U.S. Cl.
CPC .. *H01L 21/823462* (2013.01); *H01L 27/0886* (2013.01); *H01L 29/66545* (2013.01); *H01L 29/7851* (2013.01); *H01L 29/7856* (2013.01); *H01L 29/165* (2013.01)

(56) References Cited

U.S. PATENT DOCUMENTS

| | | | |
|---|---|---|---|
| 6,362,040 B1 | 3/2002 | Tews et al. | |
| 6,727,142 B1 | 4/2004 | Gluschenkov et al. | |
| 7,053,006 B2 | 5/2006 | Hyun et al. | |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2006/0086985 A1* | 4/2006 | Kishida | H01L 21/823425 257/365 |
| 2014/0001575 A1* | 1/2014 | Adams | H01L 21/845 257/412 |
| 2014/0282326 A1 | 9/2014 | Chen et al. | |
| 2015/0069525 A1* | 3/2015 | Adams | H01L 21/845 257/392 |
| 2016/0181428 A1 | 6/2016 | Chen | |
| 2016/0225905 A1* | 8/2016 | Tarui | H01L 21/049 |
| 2017/0062613 A1* | 3/2017 | Sung | H01L 29/7843 |

\* cited by examiner

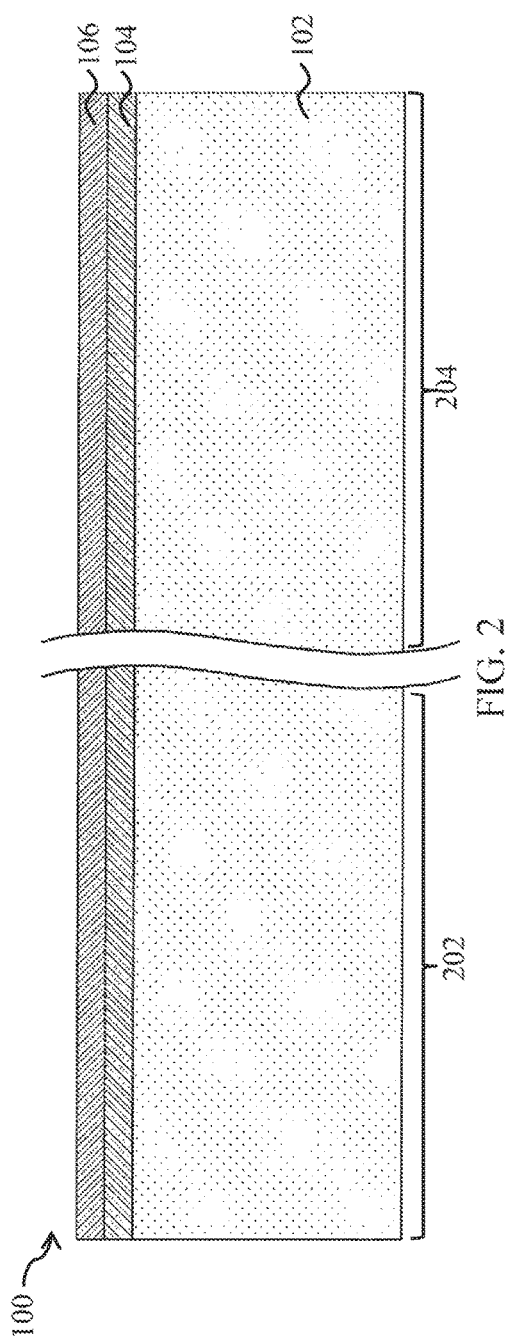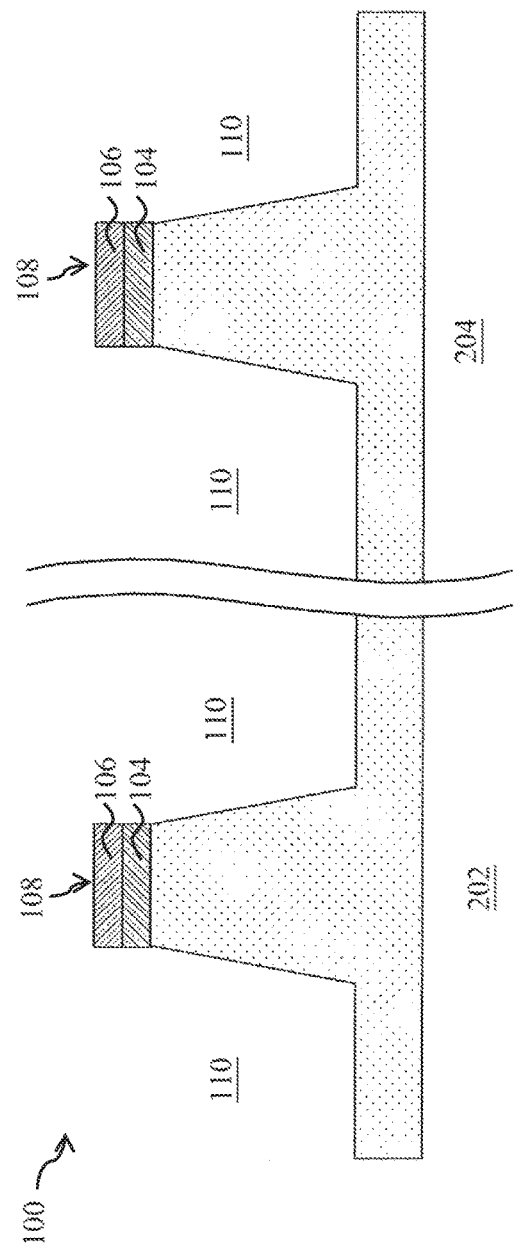

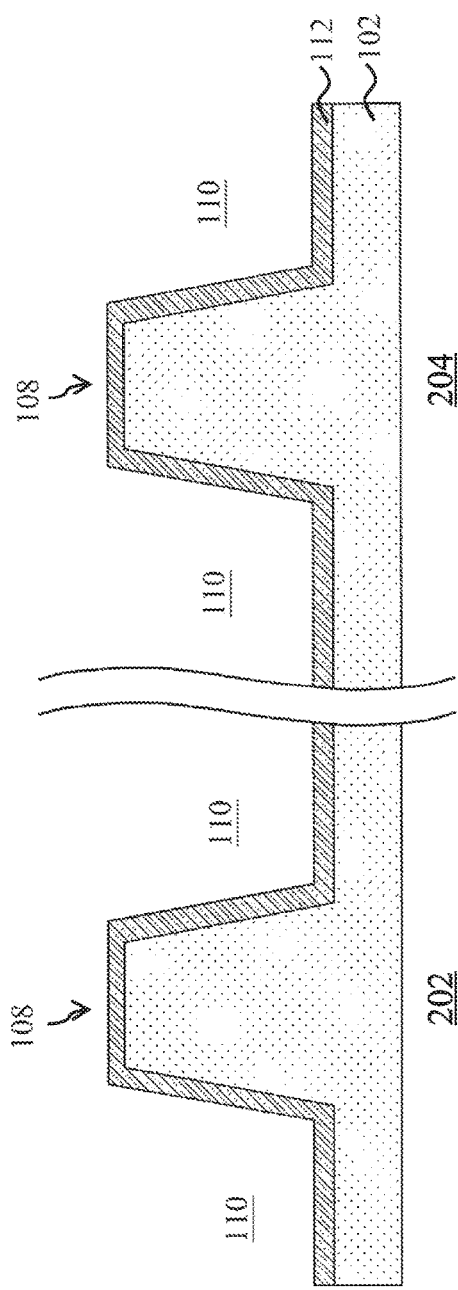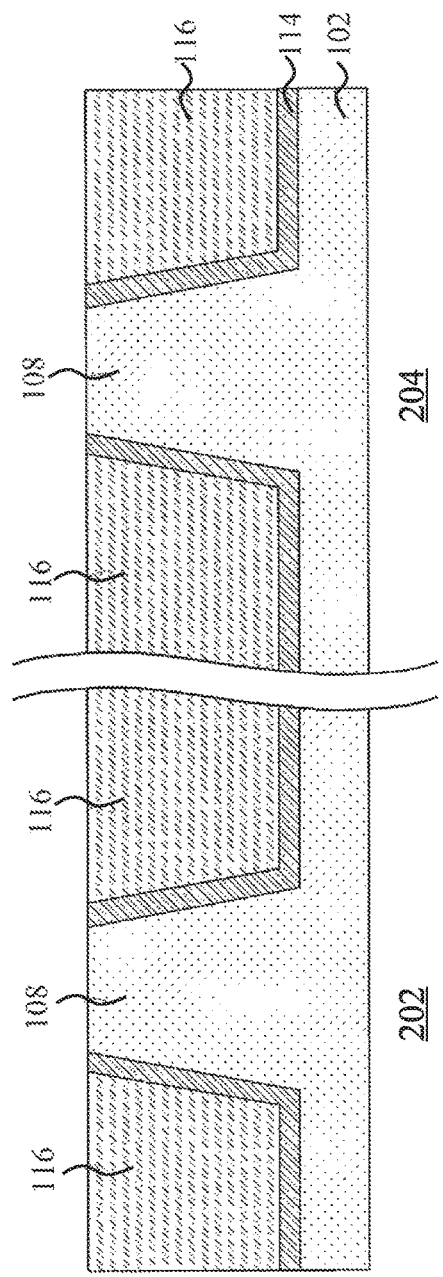

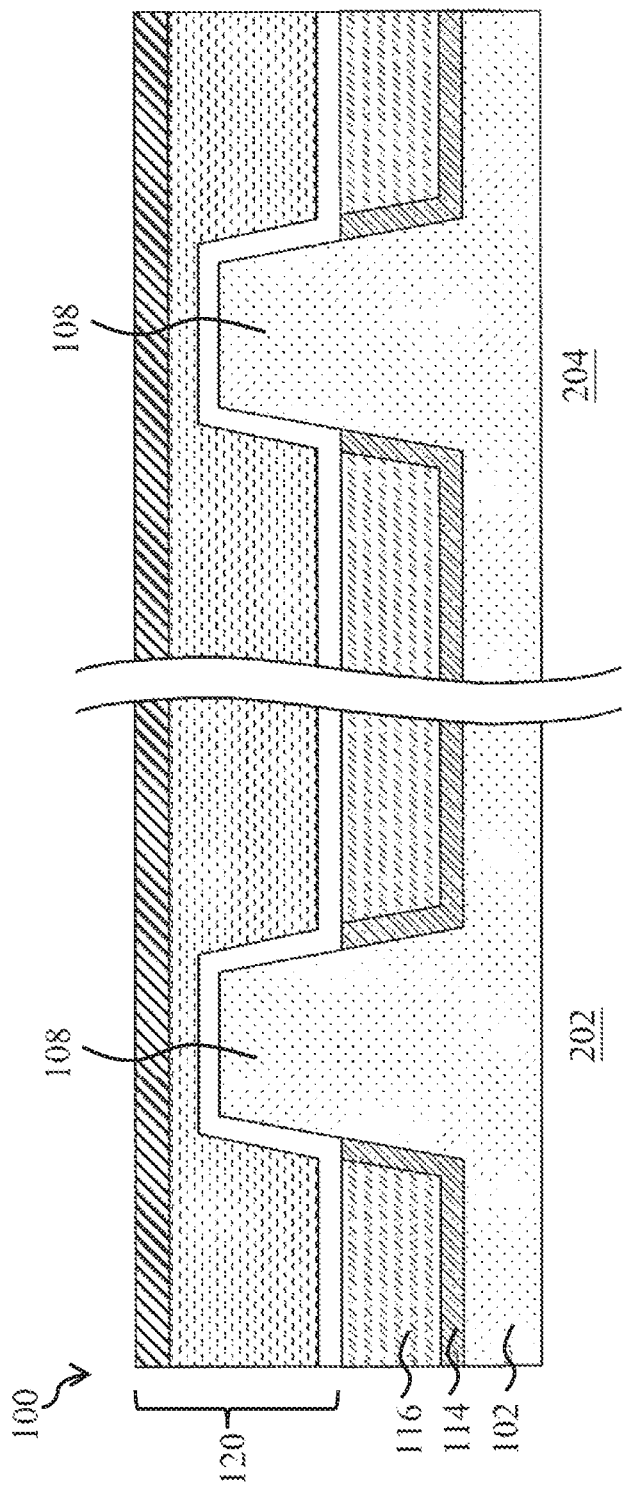

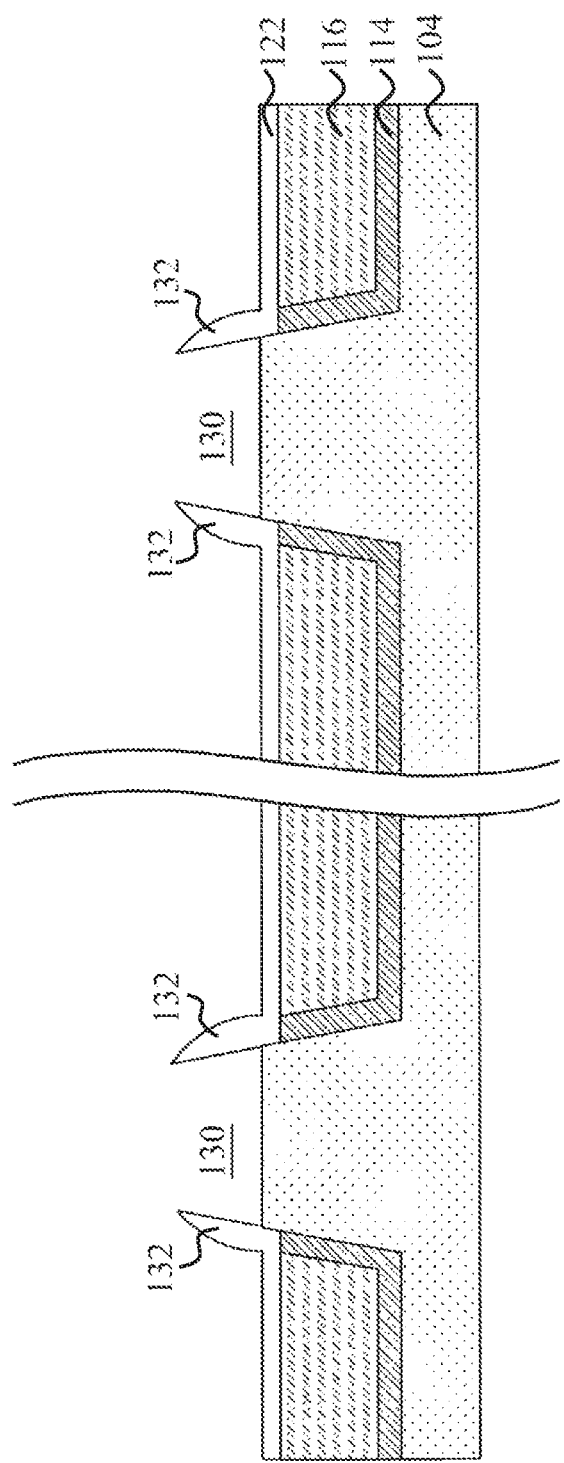

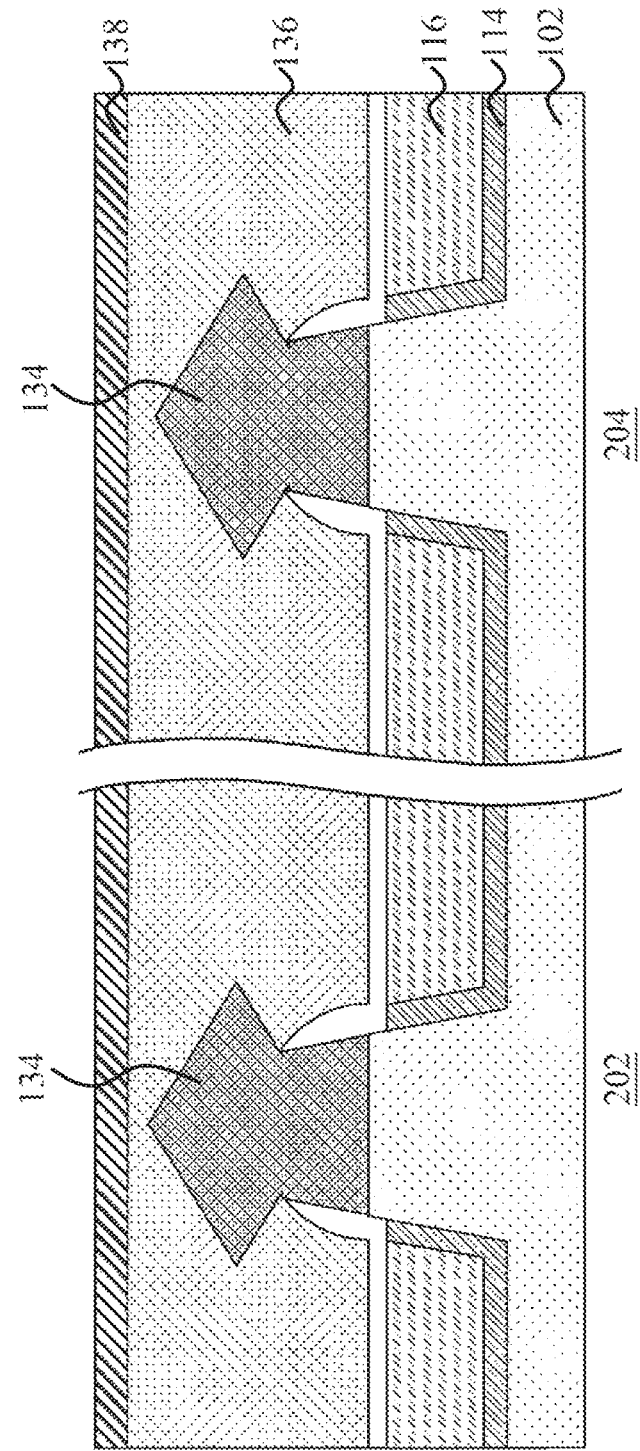

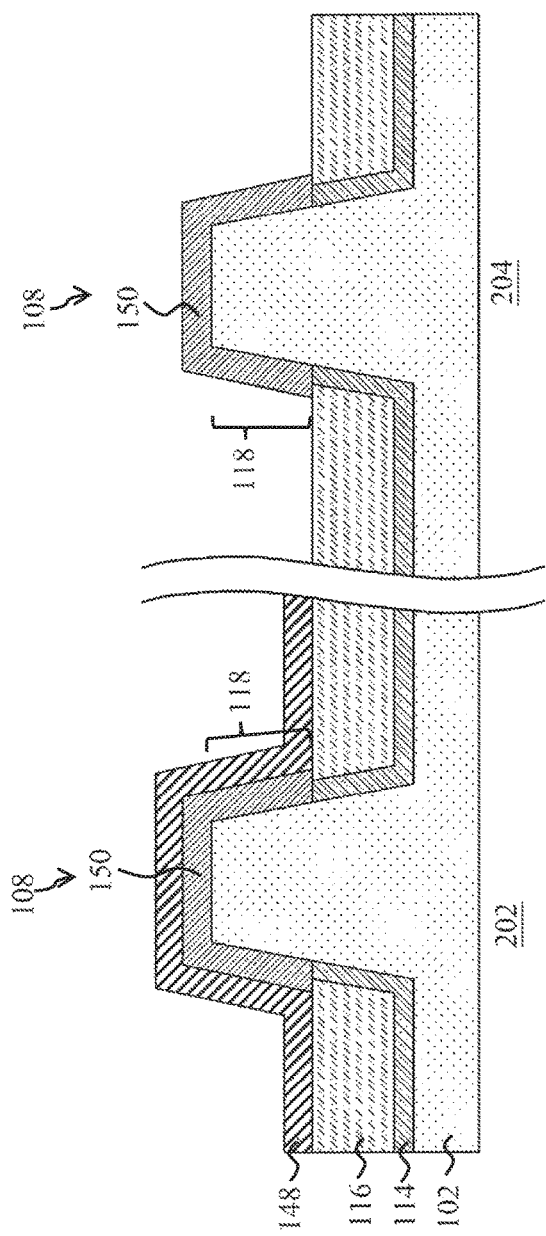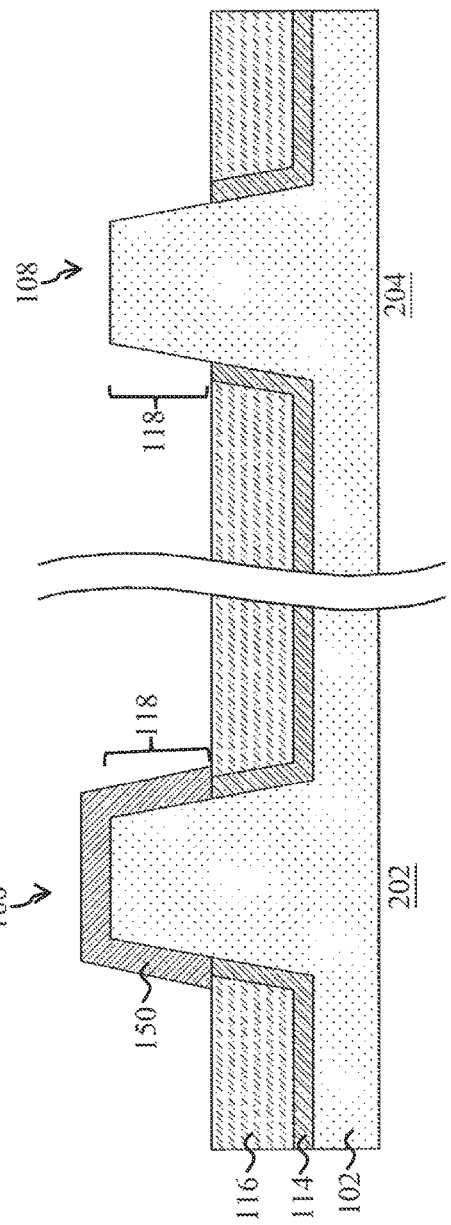

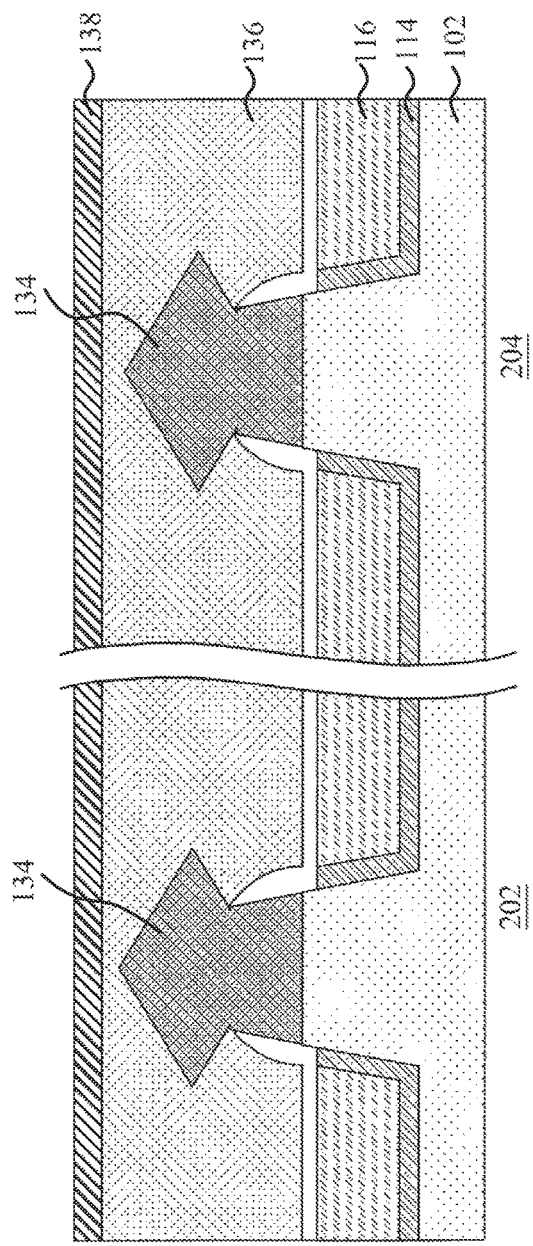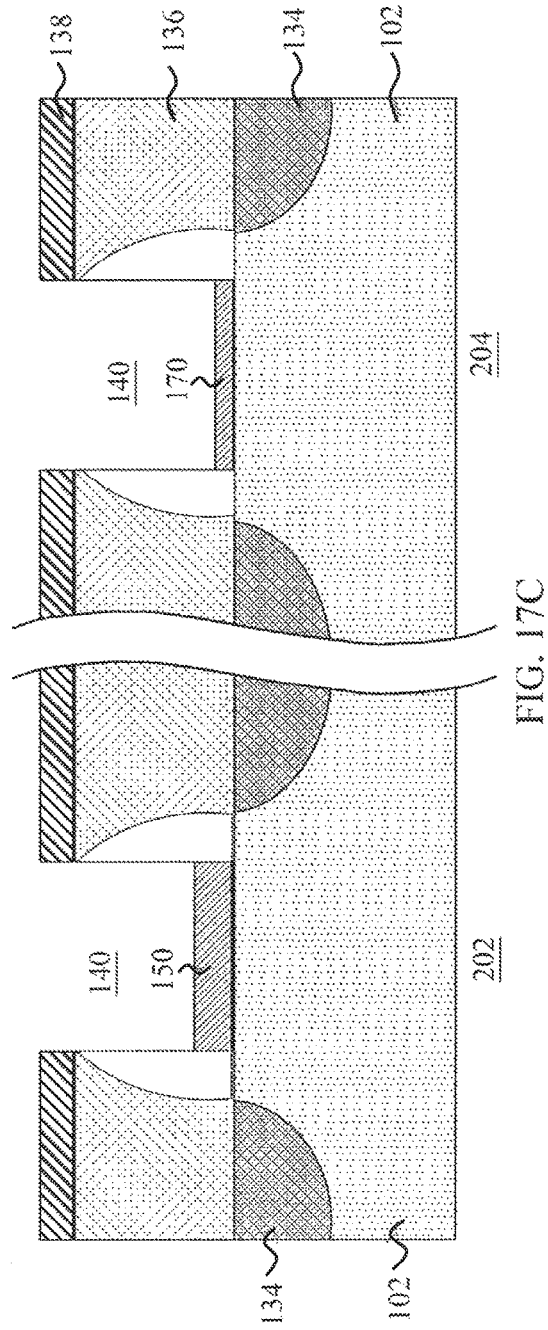
FIG. 17B
FIG. 17C

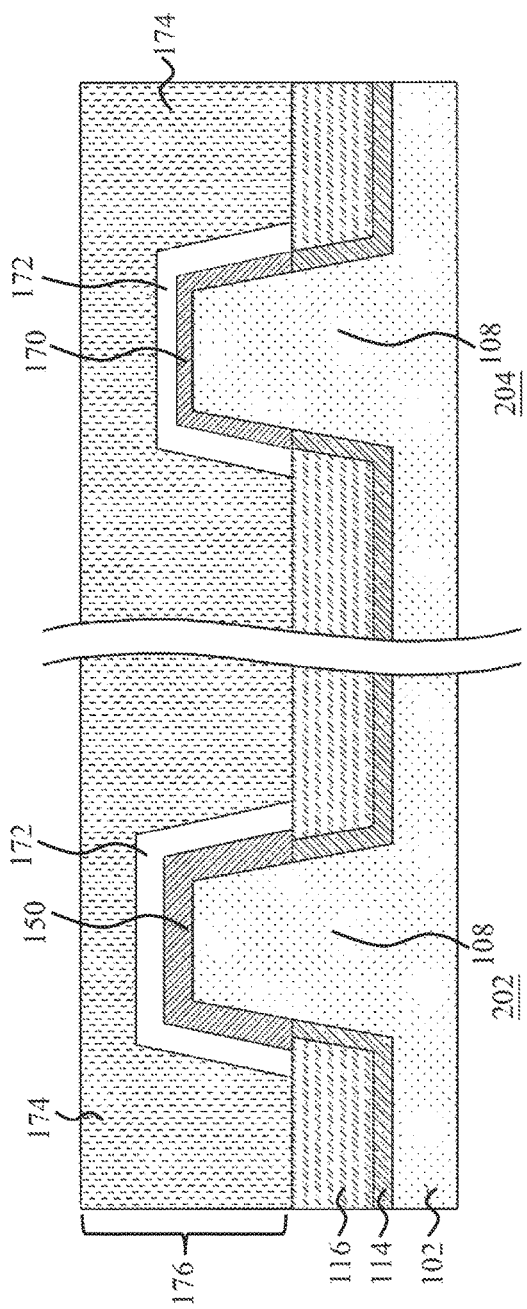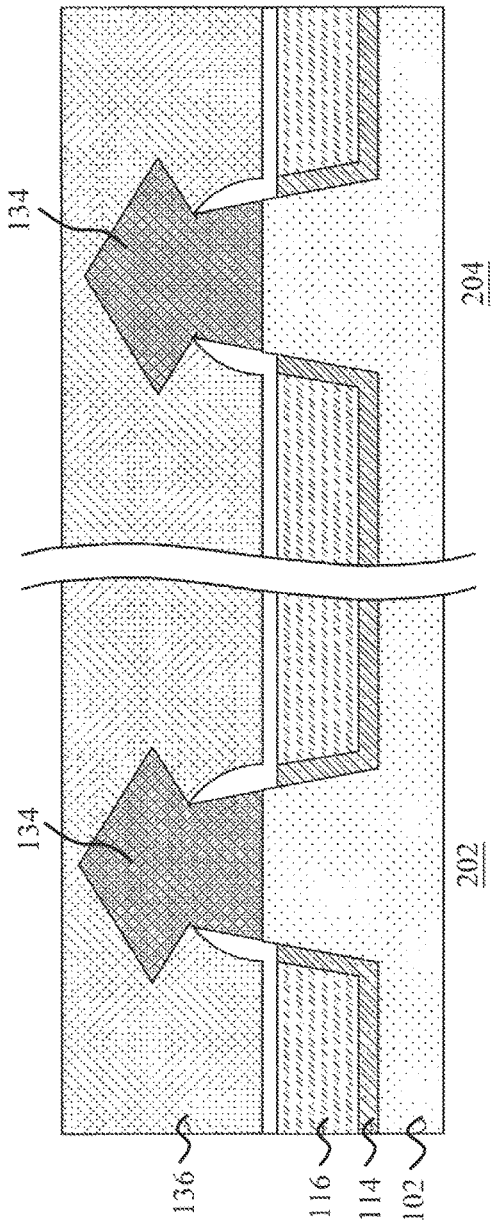
FIG. 18A
FIG. 18B

FIN FIELD EFFECT TRANSISTORS HAVING CONFORMAL OXIDE LAYERS AND METHODS OF FORMING SAME

CROSS-REFERENCE TO RELATED APPLICATIONS

This application is a divisional of application Ser. No. 14/579,955, filed Dec. 22, 2014, which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (finFETs) have been studied to overcome some of these problems.

In a typical finFET, a vertical fin structure is formed over a substrate. This vertical fin structure is used to form source/drain regions in the lateral direction and a channel region in the fin. A gate is formed over the channel region of the fin in the vertical direction forming a finFET. Subsequently, an inter-layer dielectric (ILD) and a plurality of interconnect layers may be formed over the finFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 18C illustrate cross-sectional views of intermediary stages of the manufacturing a finFET in accordance with some embodiments.

DETAILED DESCRIPTION

Figure 1:
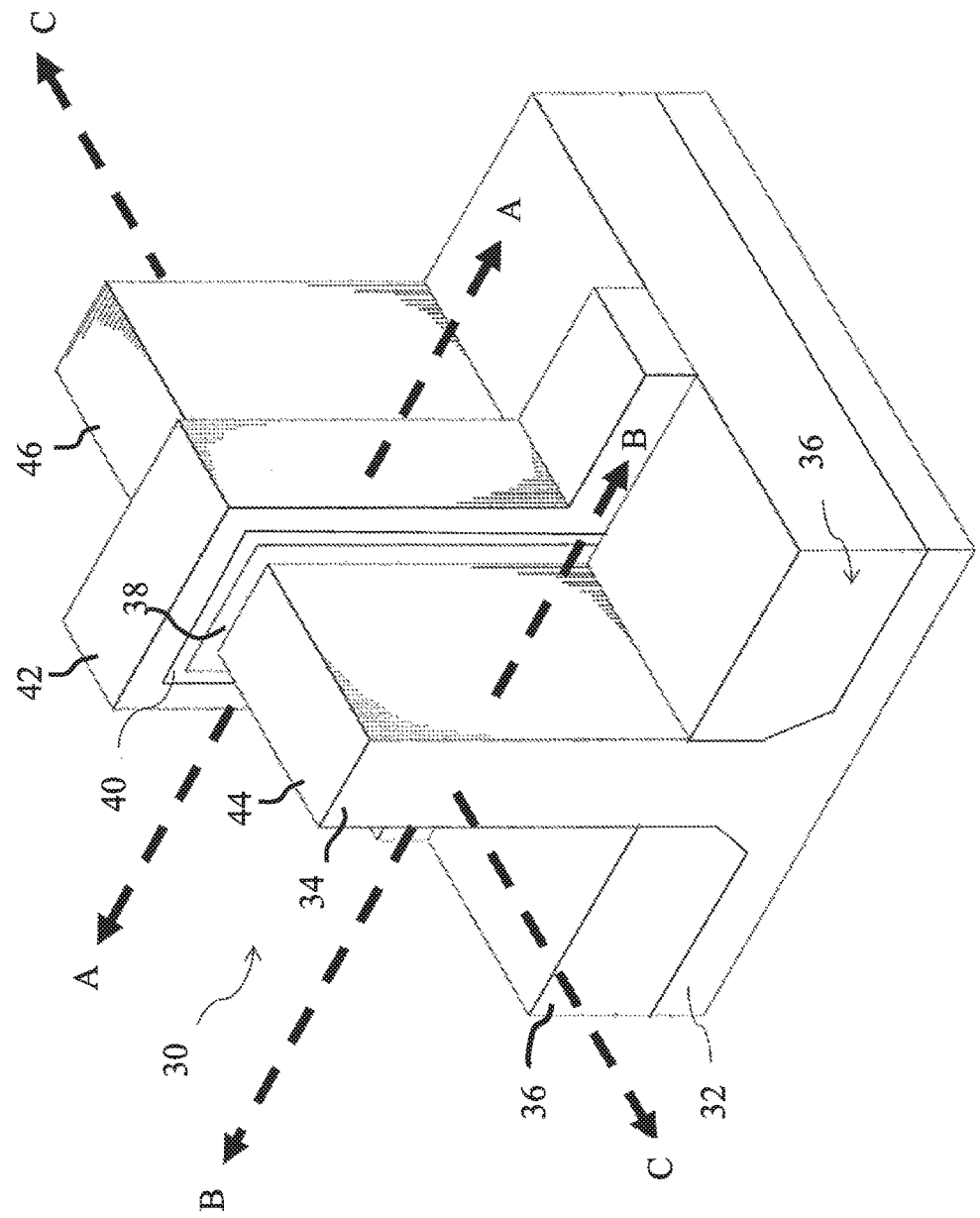
FIG. 1 is an example of a Fin Field-Effect Transistor (finFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include conformal gate oxides over channel regions of fin field effect transistors (finFETs) in a die and methods of forming thereof. The operating voltage of finFETs in the die may vary, and the thickness and uniformity of the gate oxides of each finFET may be configured in accordance with the finFET's operating voltage. For example, lower operating voltage finFETs may have thinner and more uniform gate oxides whereas higher operating voltage finFETs may have thicker and less uniform gate oxides. The formation of such gate oxides may include a surface nitridation process in combination with a suitable oxidation process, which may improve the conformity of the gate oxides.

FIG. 1 illustrates an example of a finFET 30 in a three-dimensional view. FinFET 30 includes a fin 34 on a substrate 32. Substrate 32 includes isolation regions 36, and fin 34 protrudes above and from between neighboring isolation regions 36. A conformal gate dielectric 38 is disposed along sidewalls and over a top surface of fin 34. A high-k dielectric liner 40 and a conductive gate electrode 42 are disposed over conformal gate dielectric 40. Portions of fin 34 covered by gate dielectric 38/high-k dielectric liner 40/gate electrode 42 may be referred to as a channel region of finFET 30. Source/drain regions 44 and 46 are disposed in opposite sides of fin 34 with respect to the gate dielectric 38, high-k dielectric liner 40, and gate electrode 42. FIG. 1 further illustrates reference cross-sections that are used in later figures. Cross-section A-A is across a channel, gate dielectric 38, high-k dielectric liner 40, and gate electrode 42 of finFET 30. Cross-section B-B is across a source/drain region 44 or 46 of the finFET 30. Cross-section C-C is perpendicular to cross-section A-A and is along a longitudinal axis of fin 34 and in a direction of, for example, a current flow between the source/drain regions 44 and 46. Subsequent figures refer to these reference cross-sections for clarity.

Figure 19:
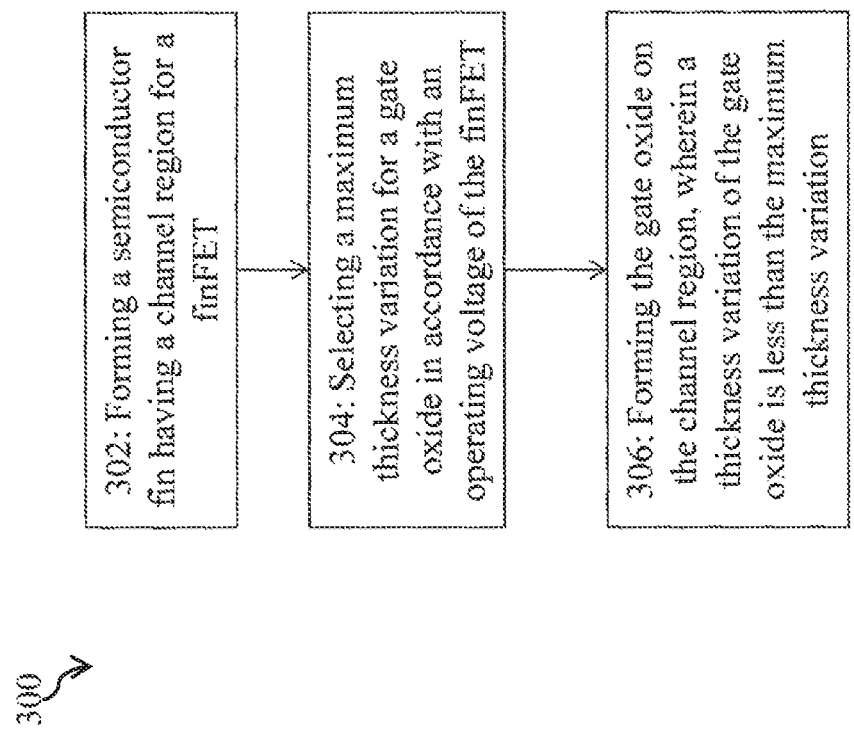
FIG. 19 illustrates a flow diagram of a method for manufacturing a finFET in accordance with some embodiments.

FIGS. 2 through 18C are cross-sectional views of various intermediary stages in the manufacturing of finFETs in accordance with various embodiments, and FIG. 19 is a process flow of the process shown in FIGS. 2 through 18C. FIGS. 2 through 6 and FIGS. 14 through 16 illustrate reference cross-section A-A illustrated in FIG. 1, except for multiple finFETs and/or finFETs having multiple fins. As discussed above, in FIGS. 7A through 13D and 17A through 18C, figures ending with an "A" designation are illustrated along a similar cross-section A-A; figures ending with a "B" designation are illustrated along a similar cross-section B-B; and figures ending with a "C" or "D" designation are illustrated along a similar cross-section C-C.

FIGS. 2 and 3 illustrate the formation of semiconductor fins extending upwards from a substrate. Referring first to FIG. 2, a wafer 100 having a substrate 102 is illustrated. Substrate 102 includes a high-voltage region 202 for forming finFET devices having a relatively high operating voltage and a low-voltage region 204 for forming finFET devices a relatively low operating voltage. In some embodiments, high-voltage region 202 may include finFETs having a threshold voltage of about of about 1.5 volts (V), about 1.8 V, or even higher. In contrast, low-voltage region 204 may include finFETs having a threshold voltage of about 0.9 V, about 0.75V, or even lower. In such embodiments, high-voltage region 202 may include input/output transistors, which convert a higher threshold, input voltage (e.g., power supply voltage) to a lower threshold voltage suitable for operating core transistors (e.g., logic, memory, or the like) in low-voltage region 204. Regions 202 and 204 may or may not be contiguous and any number of device features (e.g., isolation regions, dummy features, or the like, not shown) may be formed between high-voltage region 202 and low-voltage region 204 depending on device design. Furthermore, devices in high-voltage region 202 and/or low-voltage region 204 may have different operating voltages than those explicitly discussed above depending on device design.

Substrate 102 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 102 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As further illustrated by FIG. 2, hard mask 104 and photoresist 106 may be disposed over substrate 102. Hard mask 104 may comprise one or more oxide (e.g., silicon oxide) and/or nitride (e.g., silicon nitride) layers to prevent damage to the underlying substrate 102 during patterning. Hard mask 104 may be formed using any suitable deposition process, such as, atomic layer deposition (ALD), chemical vapor deposition (CVD), high density plasma CVD (HDP-CVD), physical vapor deposition (PVD), and the like. Photoresist 106 may comprise any suitable photosensitive material blanket deposited using a suitable process, such as, spin on coating, and the like.

FIG. 3 illustrates the patterning of substrate 102 to form fins 108 disposed between adjacent trenches 110. In an example embodiment, photoresist 106 may first be patterned by exposing photoresist 106 to light using a photomask. Exposed or unexposed portions of photoresist 106 may then be removed depending on whether a positive or negative resist is used.

The pattern of photoresist 106 may then be transferred to hard mask 108 (e.g., using a suitable etching process). Subsequently, trenches 110 are patterned into underlying substrate 102 using hard mask 104 as a patterning mask during an etching process, for example. The etching of substrate 102 may include acceptable etch processes, such as a reactive ion etch (RIE), neutral beam etch (NBE), the like, or a combination thereof. The etching may be anisotropic. Subsequently, photoresist 106 is removed in an ashing and/or wet strip processes, for example. Hard mask 104 may also be removed. Thus, fins 108 are formed in wafer 100. Fins 108 extend upwards from substrate 102 between adjacent trenches 110. In alternative embodiments (not shown), fins 108 (or portions of fins 108) may be epitaxially grown from underlying substrate 102 in addition to or in lieu of patterning substrate 102. In such embodiments, dopants of an appropriate type (e.g., p-type and/or n-type impurities) may be in-situ doped during the epitaxy.

Referring next to FIGS. 4 and 5, shallow trench isolation (STI) regions are formed in wafer 100. First, as illustrated by FIG. 4, a liner 112, such as a diffusion barrier layer, may be disposed along sidewalls of bottom surfaces of trenches 110. In some embodiments, liner 112 may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of liner 112 may include any suitable method, such as, atomic layer deposition (ALD), CVD, high density plasma (HDP) CVD, physical vapor deposition (PVD), and the like.

Next, as illustrated by FIG. 5, trenches 110 may be filled with a dielectric material, such as, silicon oxide, silicon nitride, silicon oxynitride, fluoride-doped silicate glass (FSG), or the like. In some embodiments, the resulting STI regions 116 may be formed using a high-density-plasma (HDP) CVD process, using silane ($SiH_4$) and oxygen ($O_2$) as reacting precursors. In other embodiments, STI regions 116 may be formed using a sub-atmospheric CVD (SACVD) process or high aspect-ratio process (HARP), wherein process gases may comprise tetraethylorthosilicate (TEOS) and ozone ($O_3$). In yet other embodiments, STI regions 116 may be formed using a spin-on-dielectric (SOD) process, such as hydrogen silsesquioxane (HSQ) or methyl silsesquioxane (MSQ). An annealing (or other suitable process) may be performed to cure the material of STI regions 116, and liner 114 may prevent (or at least reduce) the diffusion of semiconductor material from fins 108 into the surrounding STI regions 116 during the annealing. Other processes and materials may be used. A chemical mechanical polish (CMP) or etch back process may be used to level a top surfaces of STI regions 116, liner 114, and fins 108.

Figure 6:
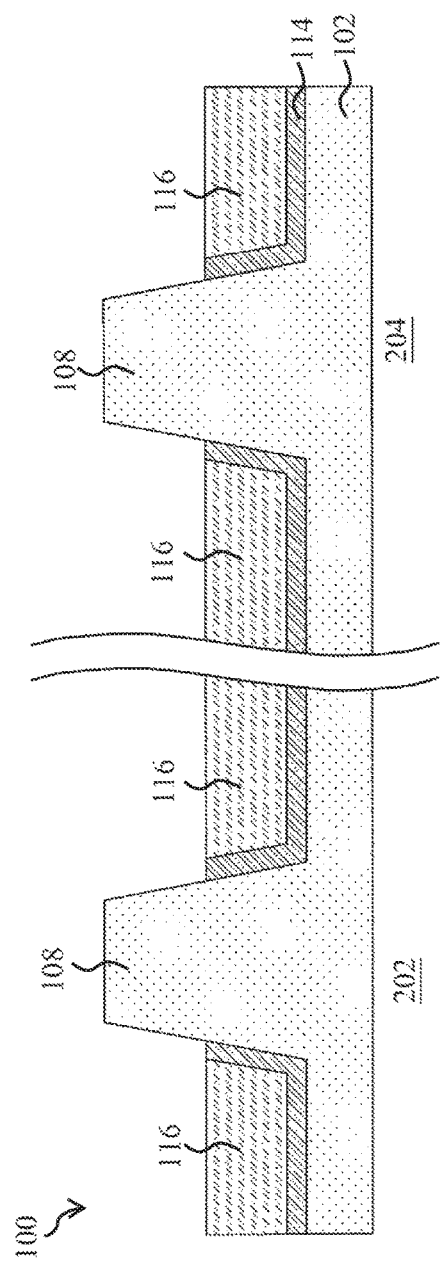

In FIG. 6, STI regions 116 are recessed, so that top portions of semiconductor fins 108 are higher than the top surfaces of STI regions 116. The recessing of STI regions 116 may include a chemical etch process, for example, using ammonia ($NH_3$) in combination with hydrofluoric acid (HF) or nitrogen trifluoride ($NF_3$) as reaction solutions either with or without plasma. When HF is used as the reaction solution, a dilution ratio of HF may be between about 1:50 to about 1:100. Liner 114 may also be recessed to be substantially level with recessed STI regions 116. After recessing, top surface and sidewalls of fins 108 are be exposed. Channel regions 118 (e.g., exposed portions of fins 108 along cross-section A-A, see e.g., FIG. 7A) are thus formed in fins 108. In the completed finFET structure, a gate stack wraps around and covers sidewalls of such channel regions 118 (see e.g., FIGS. 1 and 18A).

Figure 7A:
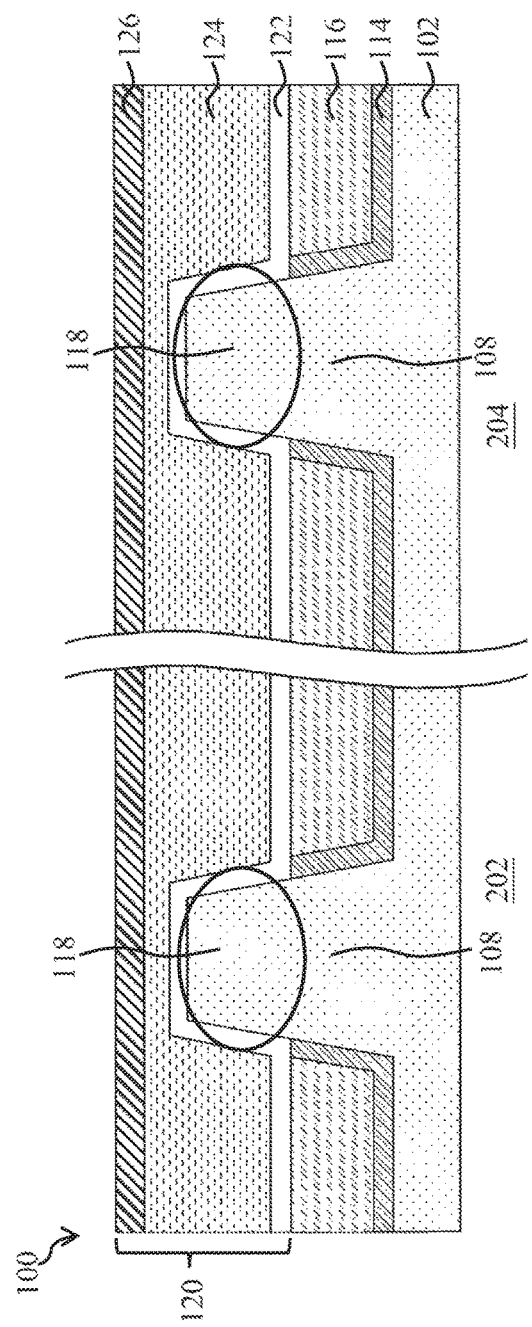
Figure 7B:
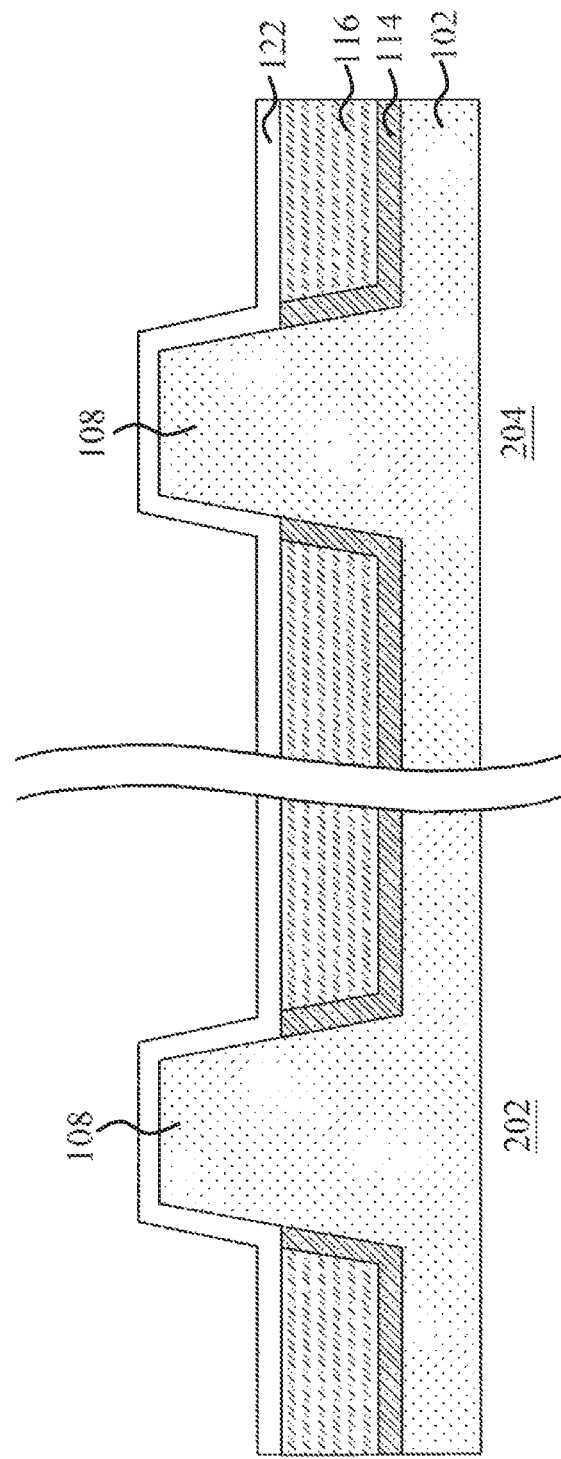
Figure 7C:
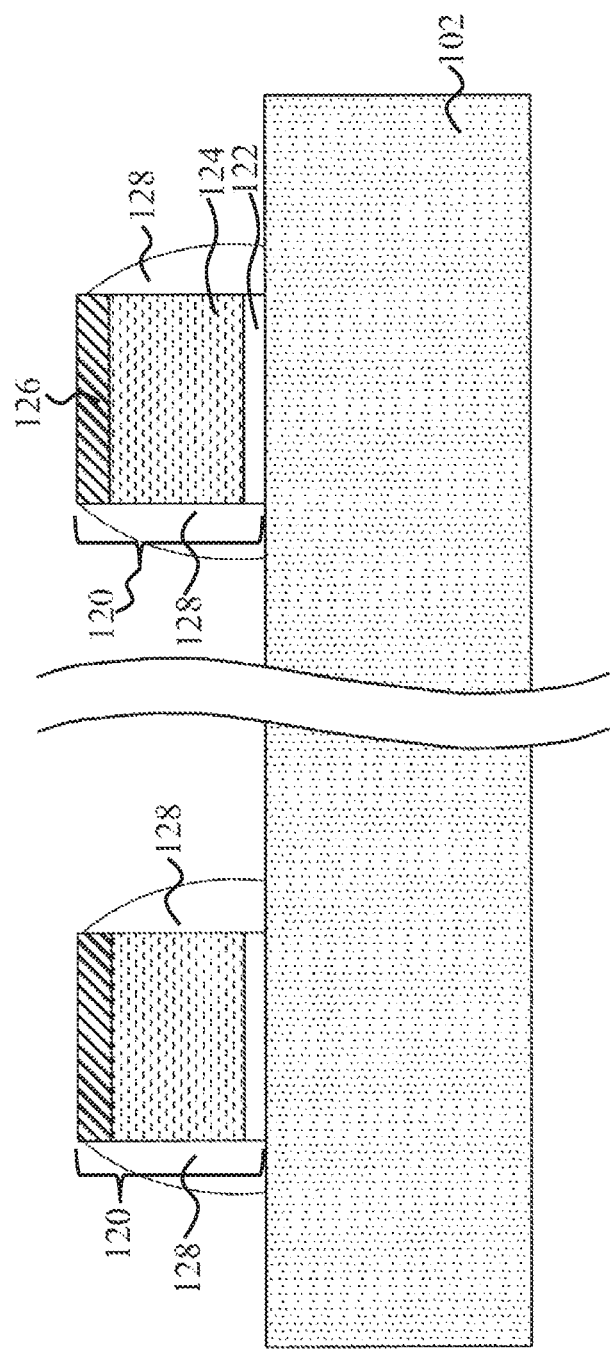

FIGS. 7A through 7C illustrate the formation of dummy gate stacks 120 on a top surface and the sidewalls of channel region 118. Gate stacks 120 include a conformal dummy oxide 122 and a dummy gate 124 over dummy oxide 122. Dummy gate 124 may comprise, for example, polysilicon, although materials such as metal silicides, metal nitrides, or the like, may also be used. Each gate stack 120 may further include a hard mask 126 over dummy gate 124. Hard mask 126 may include silicon nitride or silicon oxide, for example. Each gate stack 120 may cross over a plurality of semiconductor fins 108 and/or STI regions in some embodiments. Gate stacks 120 may also have a lengthwise direction substantially perpendicular to the lengthwise direction of semiconductor fins 108 (see e.g., FIG. 1). The formation of gate stacks 120 may further include forming dummy oxide 122 over sidewalls and a top surface of source/drain regions of fins 108 as illustrated by FIG. 7B. However, dummy gate 124 and hard mask 126 may be omitted from such source/drain regions of fins 108.

As also shown in FIG. 7C, gate spacers 128 are formed on the sidewalls of gate stacks 120. In some embodiments, gate spacers 128 are formed of silicon oxide, silicon nitride, silicon carbon nitride, or the like. Furthermore, gate spacers 128 may have a multi-layer structure, for example, with a silicon nitride layer over a silicon oxide layer.

Figure 8C:
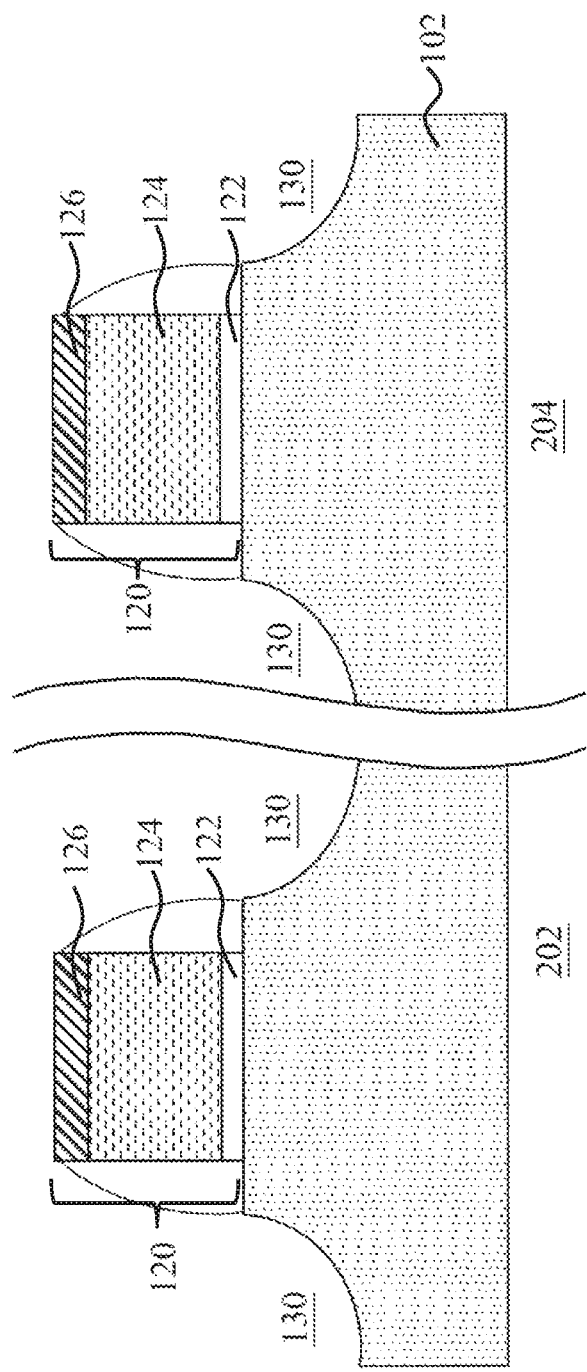

Referring to FIGS. 8A through 8C, an etching is performed to etch portions of semiconductor fins 108 that are not covered by hard mask 126 or gate spacers 128. The etching may further remove portions of dummy oxide 122 not covered by hard mask 126, which may correspond to portions of dummy oxide 122 over source/drain regions of fins 108 (see FIG. 8B). After etching, remaining portions of dummy oxide 122 may be used as major sidewall (MSW) spacers 132 for defining source/drain epitaxy areas in subsequent process steps. Alternatively, fins 108 may be recessed past a top surface of STI regions 116, and exposed sidewalls of STI regions 116 may be used to define source/drain epitaxy regions. In such embodiments, spacers 132 may be omitted. Trenches 130 are accordingly formed between adjacent spacers 132. Trenches 130 are located on opposite sides of dummy gate stack 120 (see FIG. 8C). After the formation of trenches 130, a lightly doped drain (LDD) and annealing processes may be performed on exposed surfaces of fins 108.

Figure 9A:
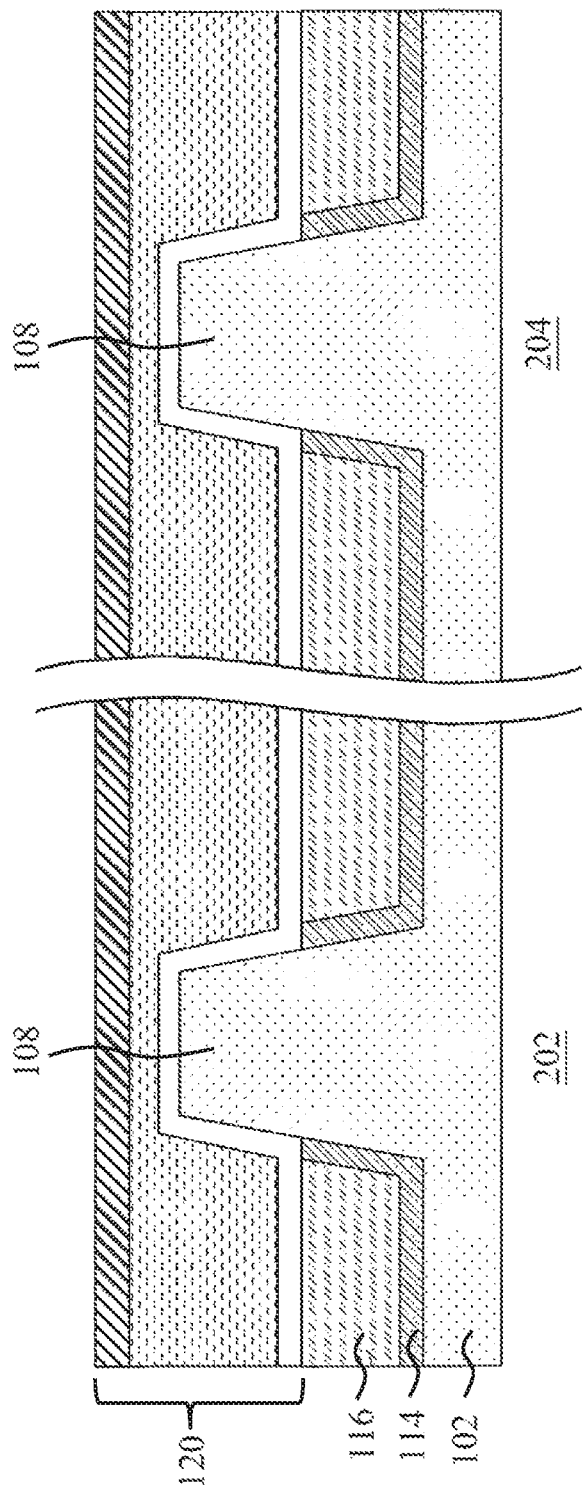
Figure 9B:
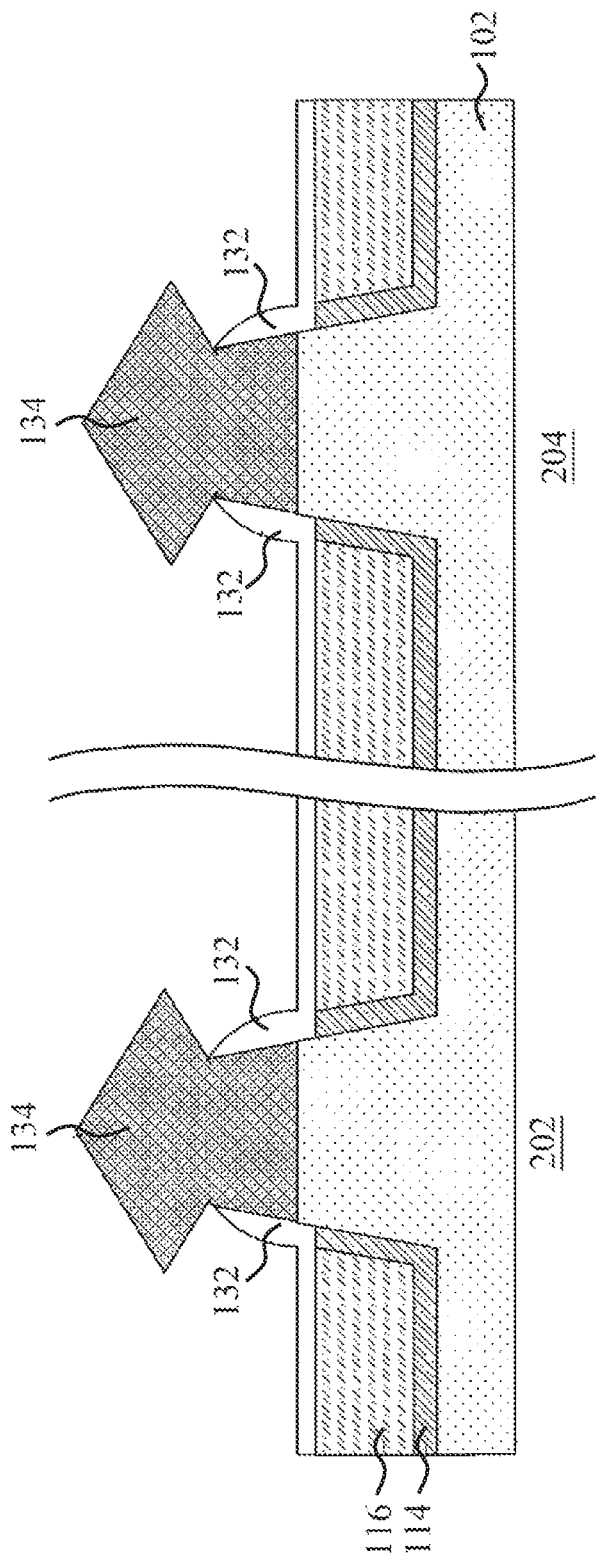
Figure 9C:
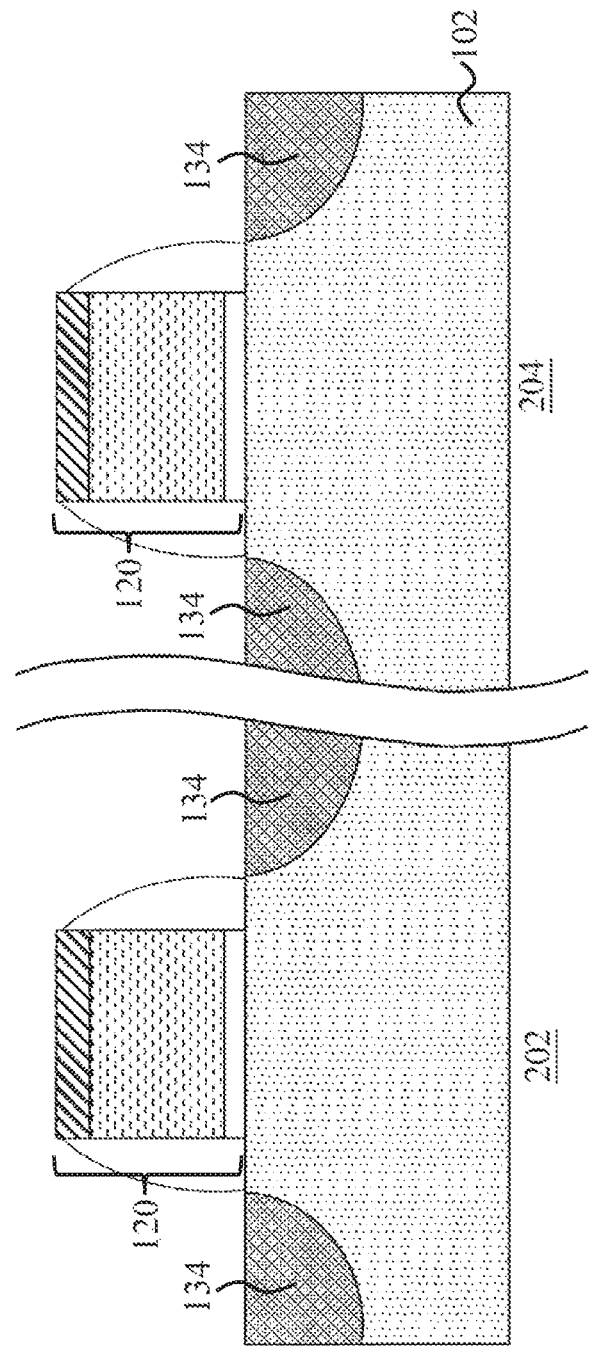

Next, as shown in FIGS. 9A through 9C, epitaxy regions 134 are formed by selectively growing a semiconductor material in trenches 130. In some embodiments, epitaxy regions 134 include silicon (with no germanium), germanium (with no silicon), silicon germanium, silicon phosphorous, or the like. Epitaxy regions 134 may also be formed of pure or substantially pure germanium, for example, with a germanium atomic percentage greater than about 95%. Hard mask 126 and spacers 132 may mask areas of wafer 100 to define an area for forming epitaxy regions 134 (e.g., only on exposed portions of fins 108). After trenches 130 are filled with epitaxy regions 134, the further epitaxial growth of source/drain regions causes epitaxy regions 134 to expand horizontally, and facets may start to form. Furthermore, some portions of STI regions 116 may be underlying and aligned to portions of epitaxy regions 134 due to the lateral growth of source/drain regions.

After the epitaxy step, epitaxy regions 134 may be implanted with p-type impurities (e.g., boron or $BF_2$) for PMOS devices or n-type impurities (e.g., phosphorous or arsenic) for NMOS devices to form source/drain regions, which are also denoted using reference numeral 134. Alternatively, the p-type or n-type impurity may be in-situ doped when epitaxy regions 134 are grown to form source/drain regions. Source/drain regions 134 are on the opposite sides of gate stack 120 (see FIG. 9C), and may be overlying and overlapping portions of surfaces of STI regions 116 (see FIG. 14B). In yet alternative embodiments, the patterning of fin 108 and subsequent epitaxy may be omitted. In such embodiments, source/drain regions 134 may simply be disposed on opposing sides of each gate stack 120/gate spacers 128.

Figure 10A:
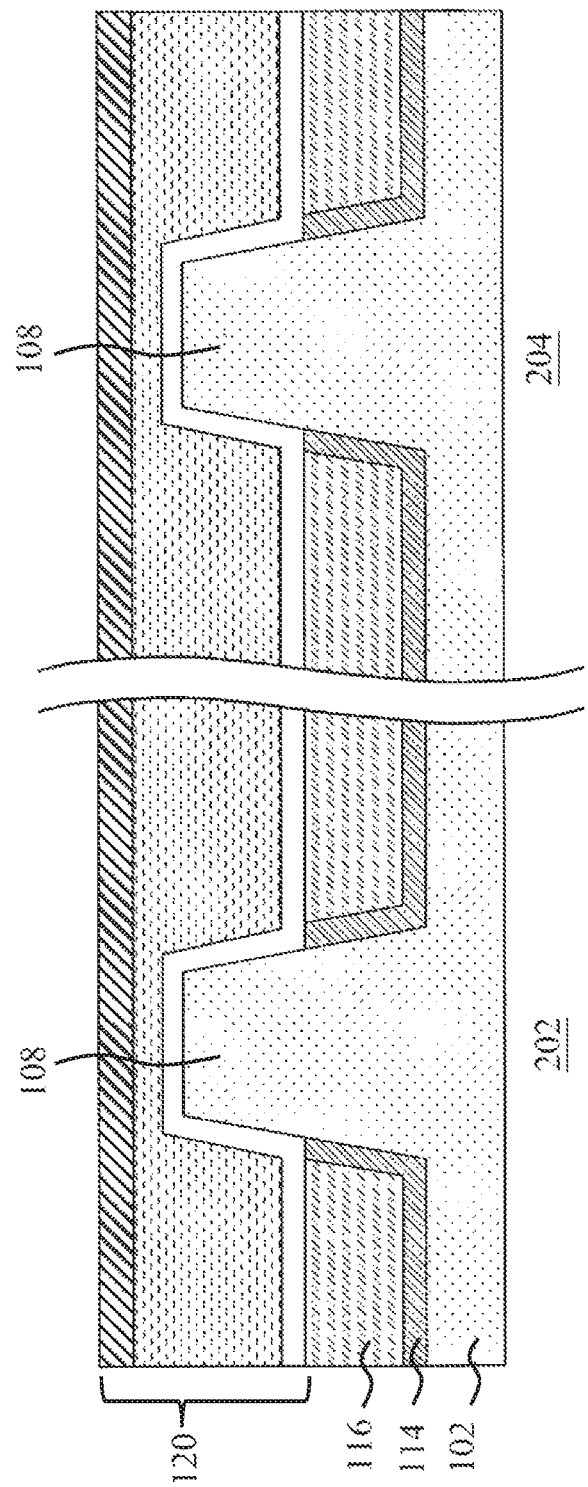
Figure 10B:
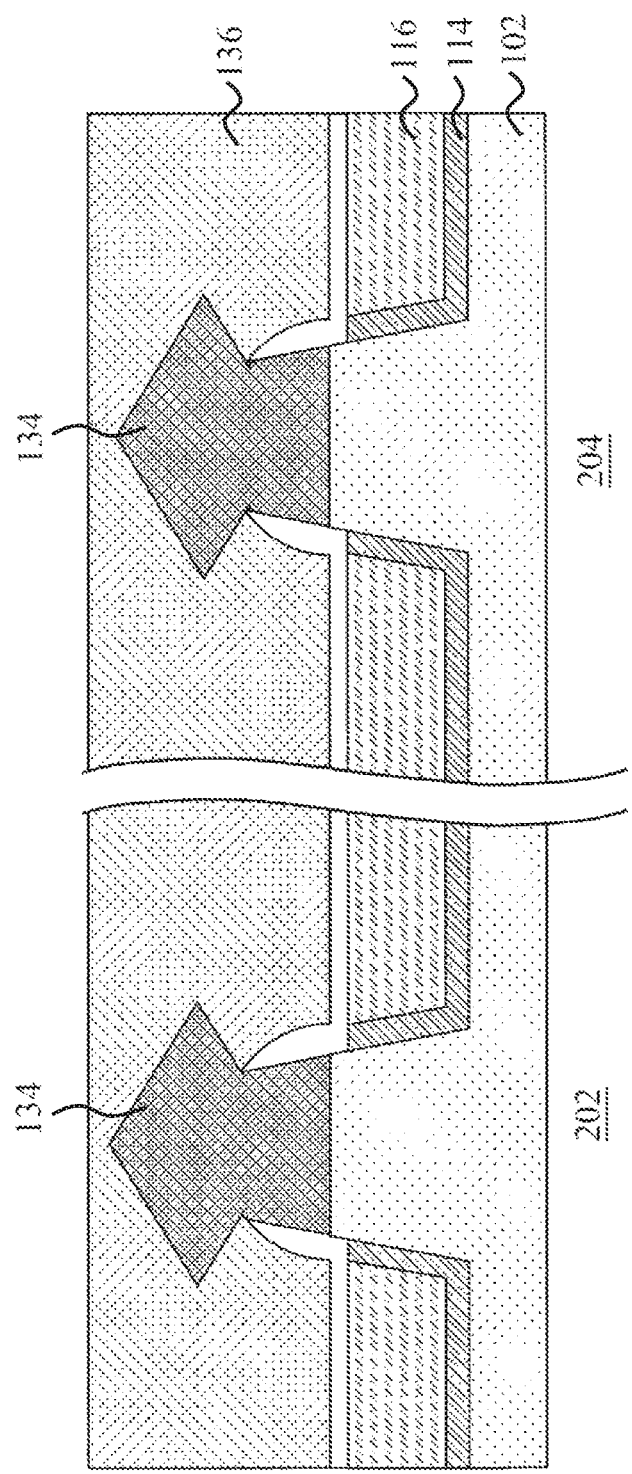
Figure 10C:
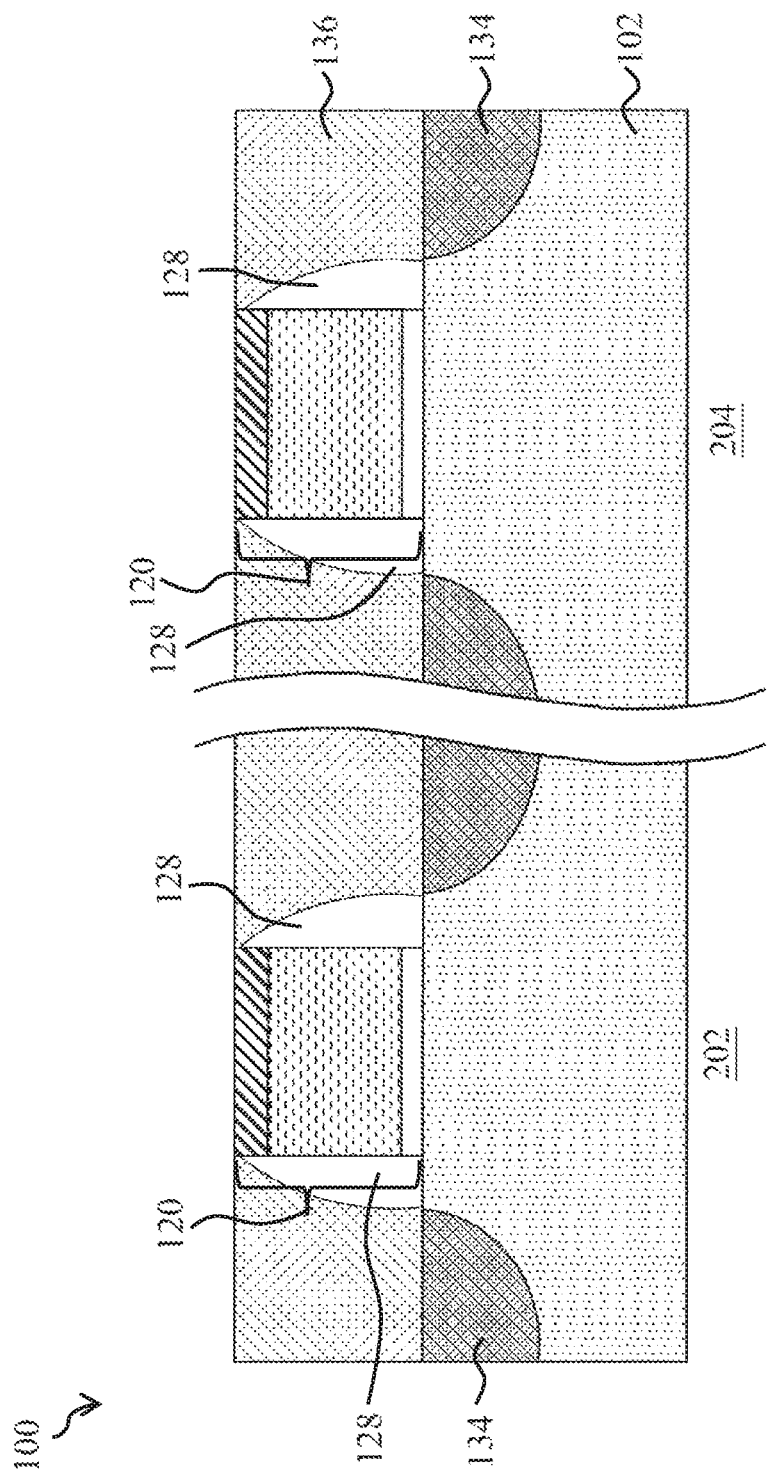

FIGS. 10A through 10C illustrate wafer 100 after interlayer dielectric 136 is formed. ILD 136 may comprise flowable oxide formed using, for example, flowable chemical vapor deposition (FCVD). A CMP (or other suitable planarization process) may be performed to level the top surfaces of ILD 136, gate stack 120, and gate spacers 128 with each other. Although not shown in detail in FIGS. 10A through 10C, various intermediary layers (e.g., buffer layers and/or etch stop layers) may be disposed between ILD layer 136 and source/drain regions 134, gate stack 120, and/or gate spacers 128.

Figure 11A:
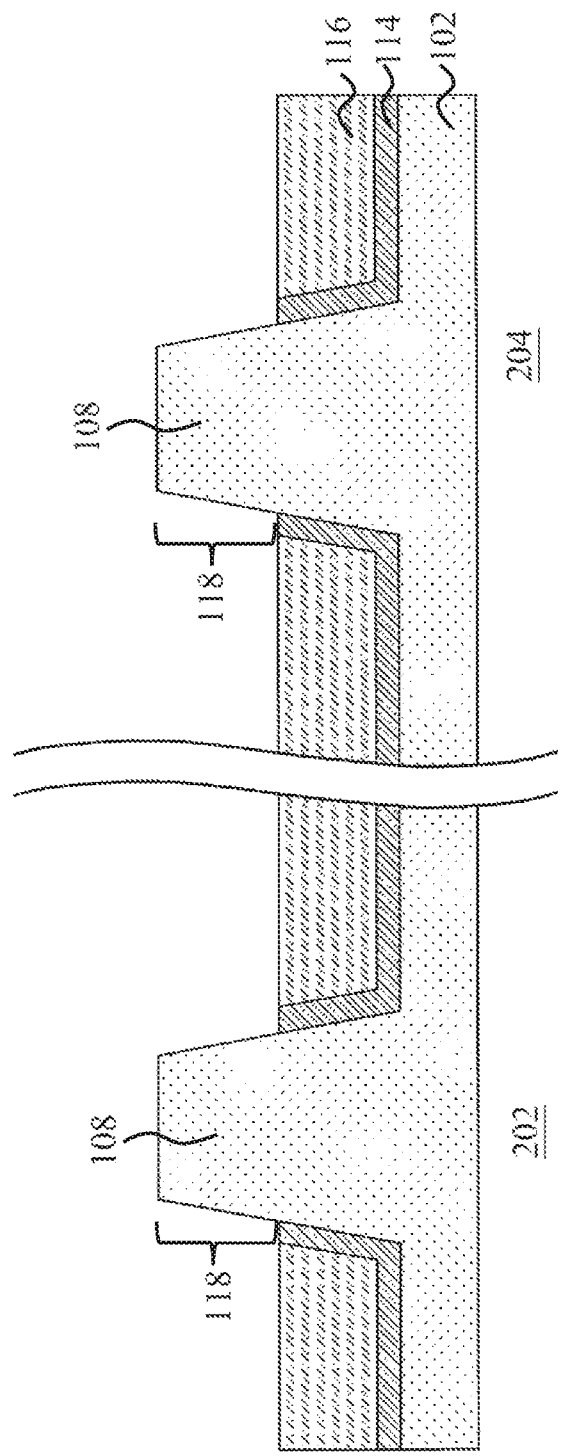
Figure 11C:
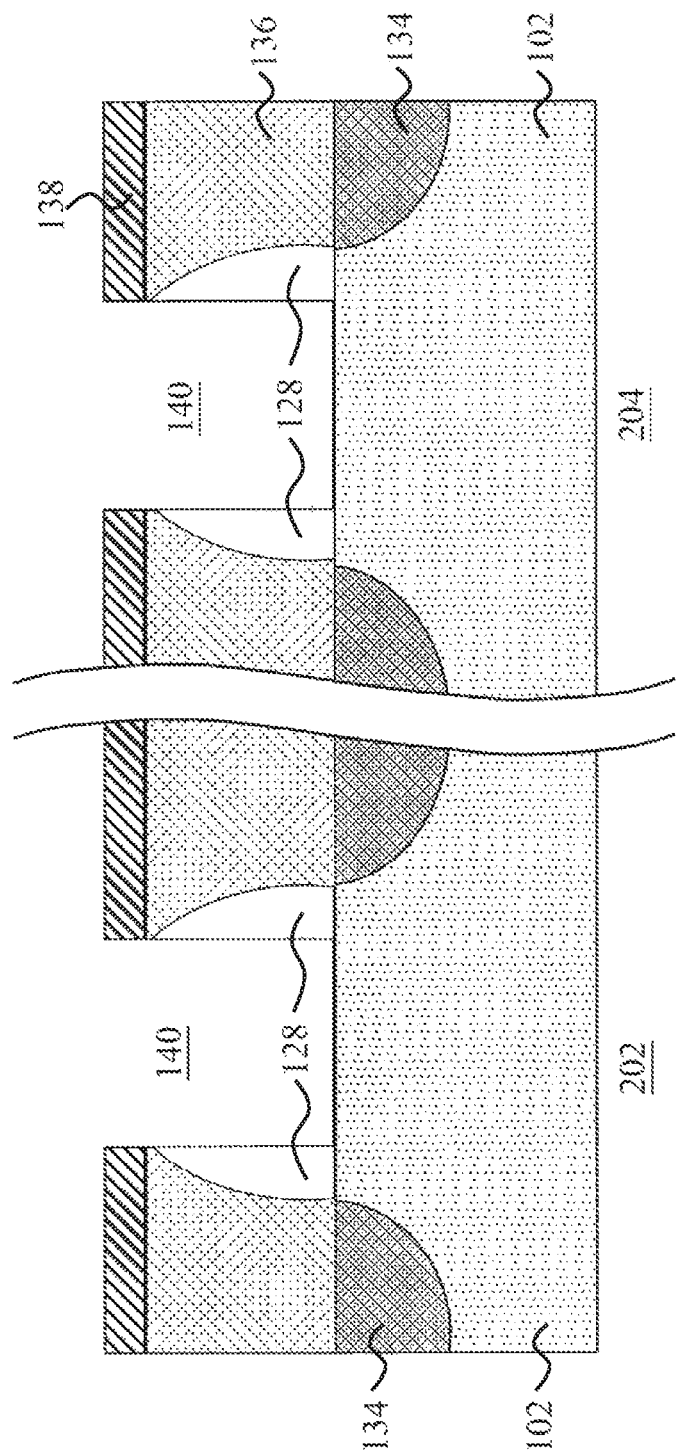
Figure 12A:
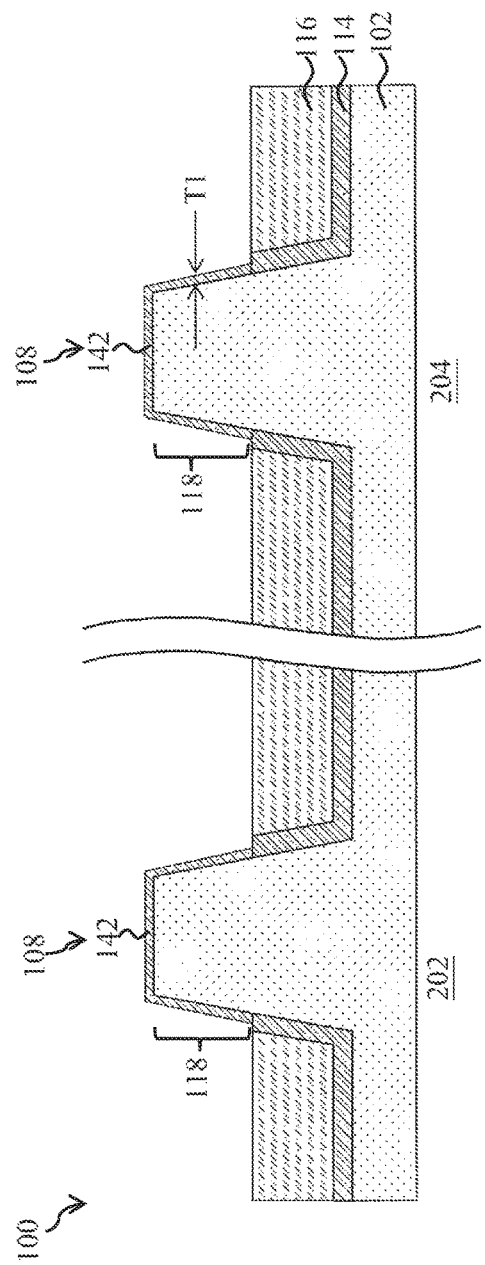
Figure 12B:
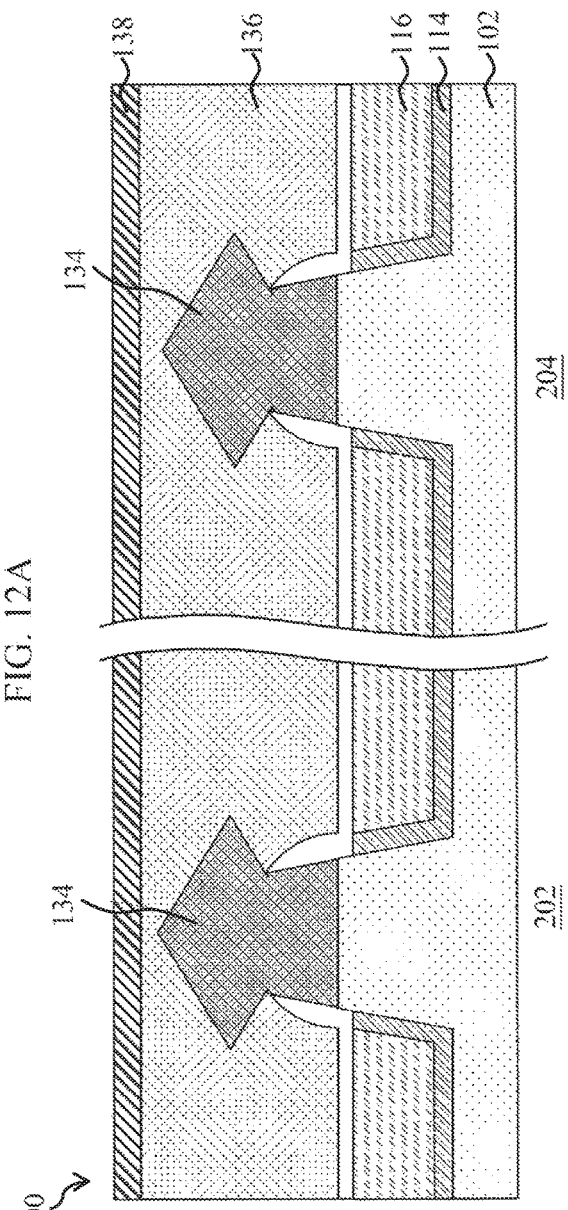
Figure 12C:
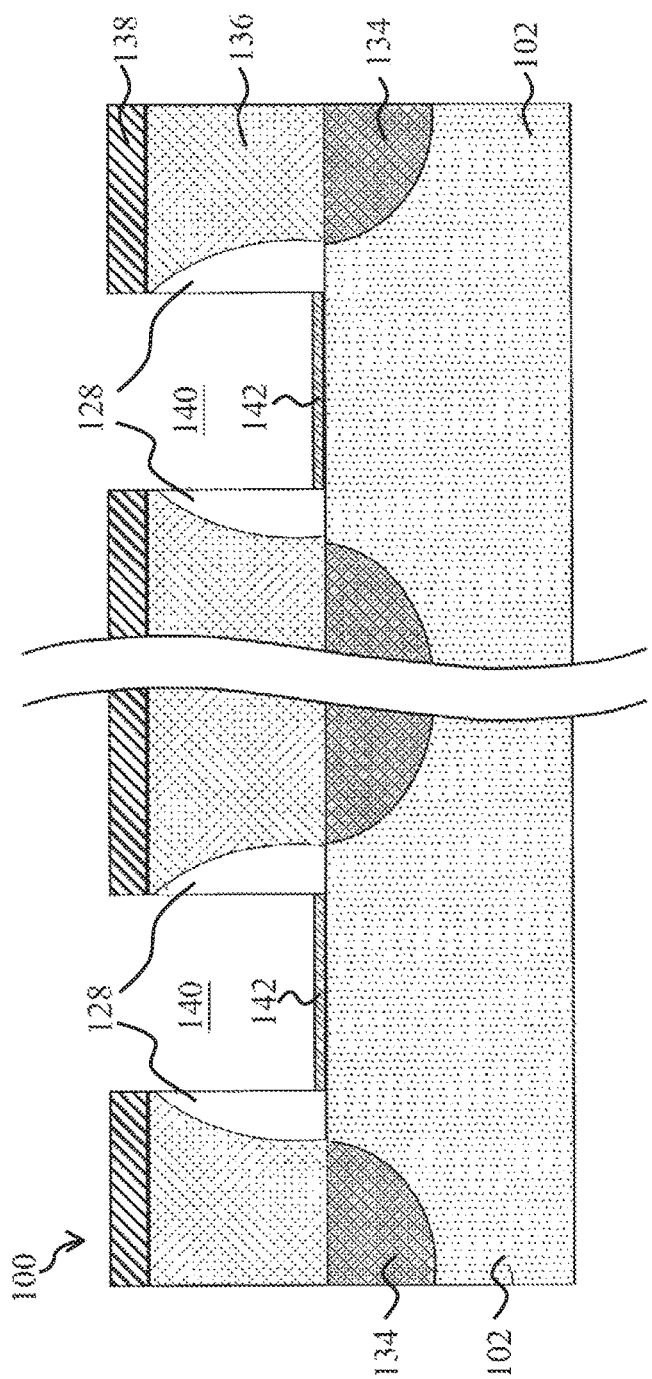
Figure 12D:
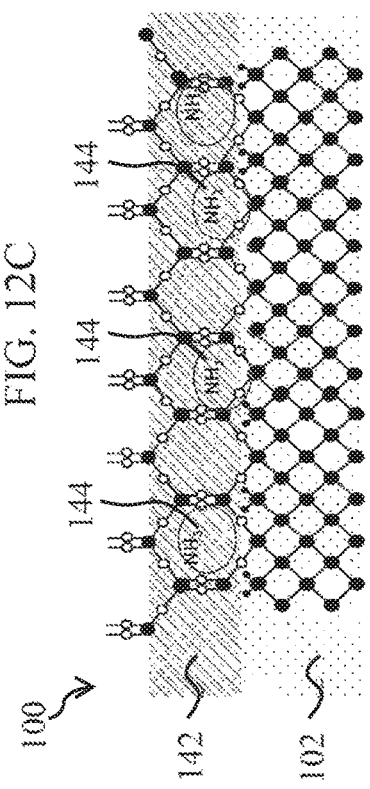

FIGS. 11A through 11C illustrate varying views of wafer 100 after exposing channel regions 118 of fins 108. Exposing channel regions 110 may include removing gate stack 120 (including hard mask 126, dummy gate 124, and dummy oxide 122) from sidewalls and top surfaces of channel regions 118. The removal of gate stack 140 may define trench 140 between gate spacers 128 (see FIG. 11C). A hard mask 128 may be used to mask ILD 136 and source/drain regions 134 during the removal of gate stack 120. Thus, gate stack 120 may be removed without patterning ILD 136 or source/drain regions 134.

FIGS. 12A through 17C illustrate the formation of conformal gate oxides 150 and 170 on channel regions 118. As will be explained in greater detail in subsequent paragraphs, a thickness and/or conformity (e.g., maximum thickness variation) of gate oxides 150 and 170 may be selected in accordance with an operating voltage of each corresponding finFET device. For example, it has been observed that finFETs having lower operating voltages may benefit from thinner and more conformal gate oxide layers than higher operating voltages finFETs. Thus, in various embodiments the thickness and/or conformity of gate oxide 150 in high-voltage region 202 may be different than the thickness and/or conformity of gate oxide layer 170 in low-voltage region 204 (see e.g., FIGS. 17A and 17C).

Referring first to FIGS. 12A through 12D, a nitride layer 142 is formed on channel regions 118. The formation of nitride layer 142 may include performing a thermal nitridation on the exposed semiconductor material of channel regions 118, for example. In such embodiments, nitride layer 142 may comprise a semiconductor nitride (e.g., silicon nitride, and the like). In some embodiments, the thermal nitridation process may include maintaining wafer 100 at a temperature of about 600° C. to about 1000° C. while a nitrogen-containing precursor chemical 144 (e.g., ammonia ($NH_3$) or diluted $N_2$, see FIG. 12D) is supplied to channel region 118 in an environment maintained at about 1 Torr to about 760 Torr of pressure. The resulting nitride layer 122 may have a thickness T1 of about 6 Å to about 15 Å and may contain an atomic percentage of nitrogen of about 2% to about 30%, for example. Other suitable nitridation processes may also be used. The thermal nitridation process may selectively form nitride layer 142 on exposed semiconductor material of fins 108 without forming nitride layer 142 on other surfaces (e.g., STI regions 116 or hard mask 138) of wafer 100. It has been observed that by first forming a nitride layer on channel regions 118, greater conformity can be achieved in subsequently formed gate oxides (e.g., gate oxides 150 and 170).

Figure 13A:
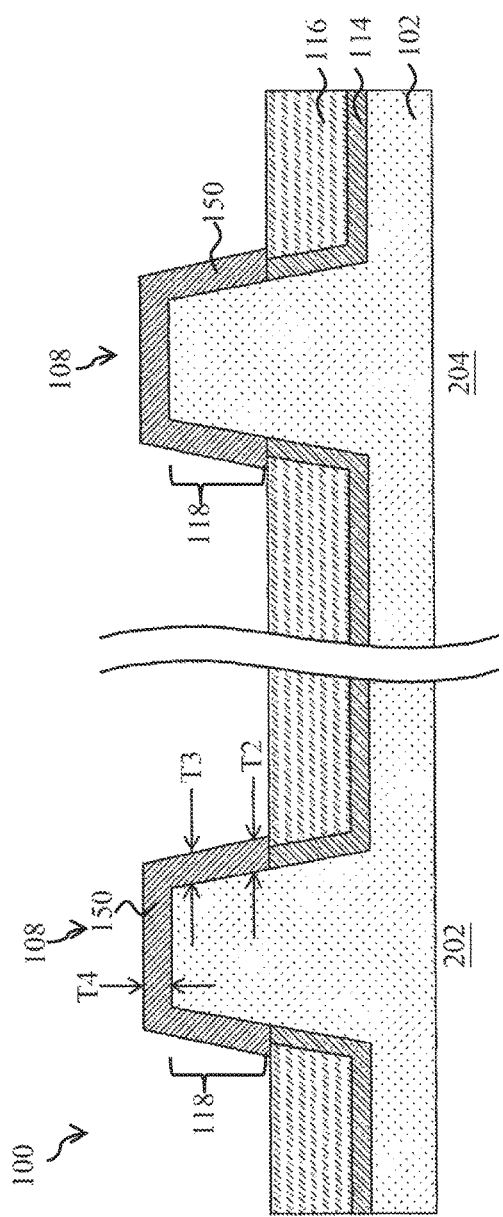
Figure 13B:
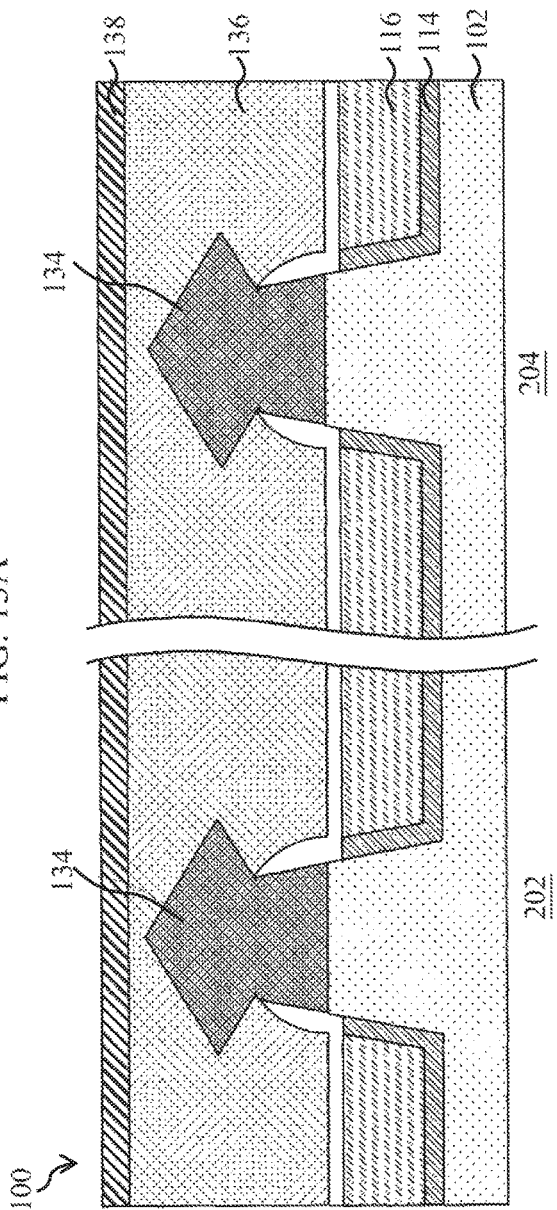
Figure 13C:
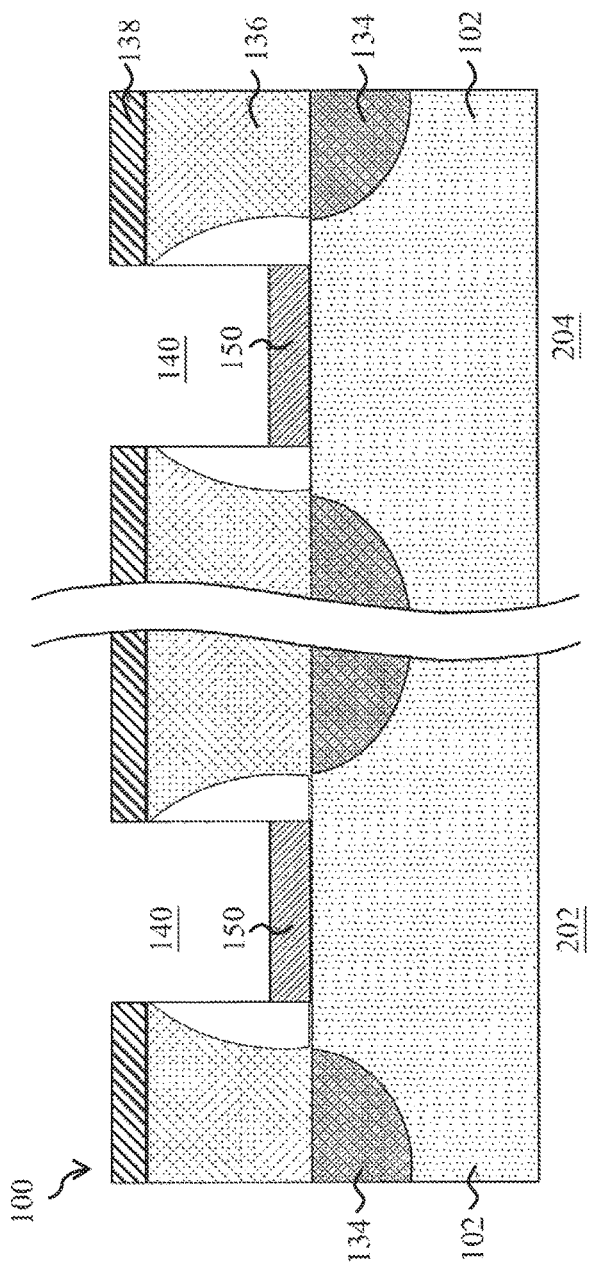
Figure 13D:
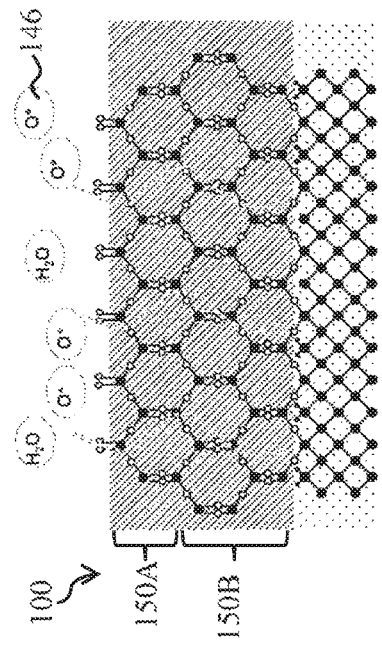

In FIGS. 13A through 13D, an oxidation is performed to form a first conformal gate oxide 150 on channel regions 118. Gate oxide 150 may be formed by performing any suitable oxidation process on the nitridated surface of channel regions 118. For example, after nitride layer 142 is formed, an in-situ steam generation (ISSG) process may be used to form gate oxide 150 on channel regions 118. In such embodiments, the ISSG process may consume nitride layer 142, and in the resulting structure gate oxide 150 may include a semiconductor oxynitride layer 150A (e.g., comprising SiON) over a semiconductor oxide layer 150B (e.g., comprising SiO) as illustrated by FIG. 13D. In some embodiments, the ISSG process may include maintaining wafer 100 at a temperature of about 850° C. and about 950° C. while steam (indicated by molecules 146 in FIG. 13D) is supplied over channel region 118. Other suitable oxidation processes may also be used. The oxidation process may selectively form gate oxide 150 on channel regions 118 without forming gate oxide 150 on other surfaces (e.g., STI regions 116 or hard mask 138) of wafer 100.

As illustrated by FIG. 13A, the resulting gate oxide 150 may have a thickness T2 on a bottom edge of channel region 118, a thickness T3 on a sidewall of channel region 118, and a thickness T4 on a top surface of channel region 118. Thicknesses T2, T3, and T4 may not be exactly equal due to the different crystalline orientations of the semiconductor material of fins 108. For example, thickness T2 at a bottom edge of channel regions 118 may be less than thicknesses T3 and T4 on sidewalls and a top surface of channel regions 118. It has been observed that both the thickness and conformity of gate oxide 150 may affect the reliability of finFETs. For example, given a desired operating voltage for a finFET, a desired reliability (e.g., less than 2% failure rate) of the finFET may be provided by selecting a suitable thickness and conformity for gate oxide 150. In subsequent paragraphs, the conformity of gate oxide 150 may be defined as a maximum thickness variation (e.g., a difference) between a thinnest portion and a thickest of a gate oxide. Thus, in various embodiments, the dimensions and conformity of thicknesses T2, T3, and T4 may be selected based on a desired operating voltage of finFETs in high-voltage region 202. For example, in embodiments when the operating voltage of devices in high-voltage region 202 is about 1.8V, thicknesses T2, T3, and T4 may be between about 30 Å to about 50 Å with a difference between a thickest point (e.g., thickness T3 or T4) and a thinnest point (e.g., thickness T2) of gate oxide 150 may be less than about 7 Å. As another example, in embodiments where the operating voltage of devices in high-voltage region 202 is about 1.5V, thicknesses T2, T3, and T4 may be between about 25 Å to about 45 Å with a difference between a thickest point (e.g., thickness T3 or T4) and a thinnest point (e.g., thickness T2) of gate oxide 150 may be less than about 5 Å. Generally speaking, it has been observed that lower operating voltage devices may require thinner and/or more uniform gate oxides to achieve a same reliability as higher operating voltage devices.

In various embodiments, the thickness and/or conformity of gate oxide 150 may be controlled by selecting a suitable thickness of nitride layer 142 and/or controlling the process conditions of the oxidation process. For example, higher oxidation temperatures may provide for a more conformal gate oxide layer. As another example, a thicker nitride layer 142 may result in a more conformal gate oxide without increasing the processing temperature of the subsequent oxidation process. In such embodiments, the lower-temperature oxidation process may advantageously reduce the risk of diffusion of dopants/semiconductor material from semiconductor substrate 102 and/or source/drain regions 134 into surrounding device layers (e.g., STI regions 116, ILD 136, and the like). For example, ISSG processes performed at a temperature less than about 950° C. may advantageously reduce the risk of diffusion from semiconductor substrate 102.

Because the operating voltage of devices in high-voltage region 202 and low-voltage region 204 may differ, it may be desirable to form a thinner and more uniform gate oxide in low-voltage region 204. FIGS. 14 through 17C illustrate the formation of a thinner gate oxide 170 on channel region 118 in low-voltage region 204. Referring first to FIGS. 14 and 15, gate oxide 150 is removed from low-voltage region 204. The removal of gate oxide 150 from low-voltage region 204 may include a suitable etching process, such as, dry etching, wet etching, RIE, or the like. A hard mask 148 may be formed over and protect gate oxide 150 in high-voltage region 202 during the etching of low-voltage region 204. After gate oxide 150 if removed from low-voltage region 204, hard mask 148 may also be removed.

Figure 16:
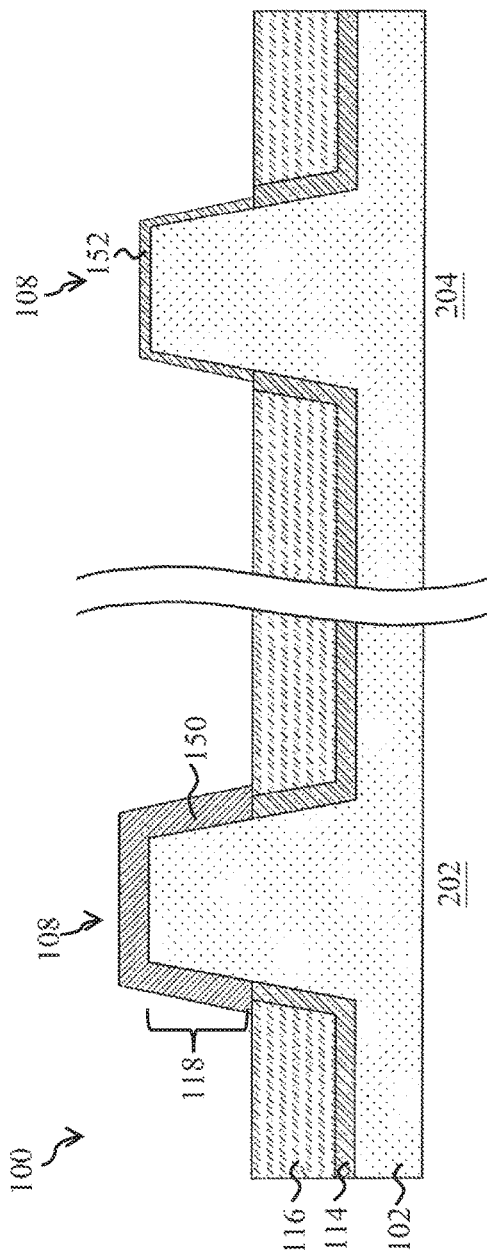

Next, as illustrated by FIG. 16, a nitride layer 152 is formed on exposed semiconductor surfaces of channel region 118 in low-voltage region 204. The formation of nitride layer 152 may include a substantially similar process as the formation of nitride layer 142 (see FIGS. 12A through 12D). As discussed above, the nitridation process may selectively form nitride layer 152 on exposed semiconductor surfaces without forming nitride layer 152 on other surfaces of wafer 100 (e.g., gate oxide 150 and/or STI regions 116). In some embodiments, nitride layer 152 may be thicker than nitride layer 142 to achieve increased conformity in subsequently formed gate oxide 170 (see FIGS. 17A and 17C).

Figure 17A:
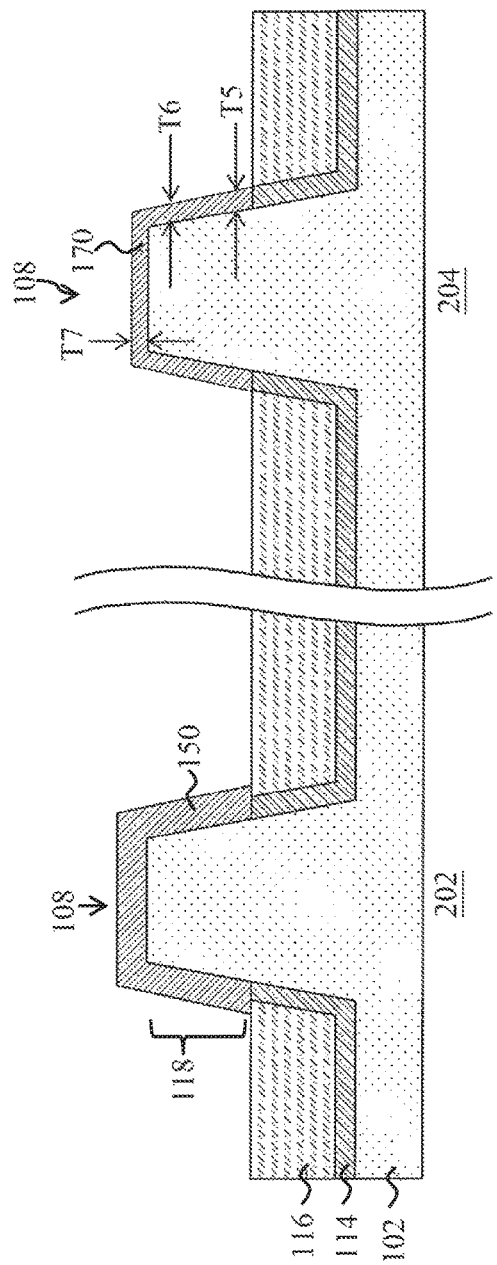
Figure 18C:
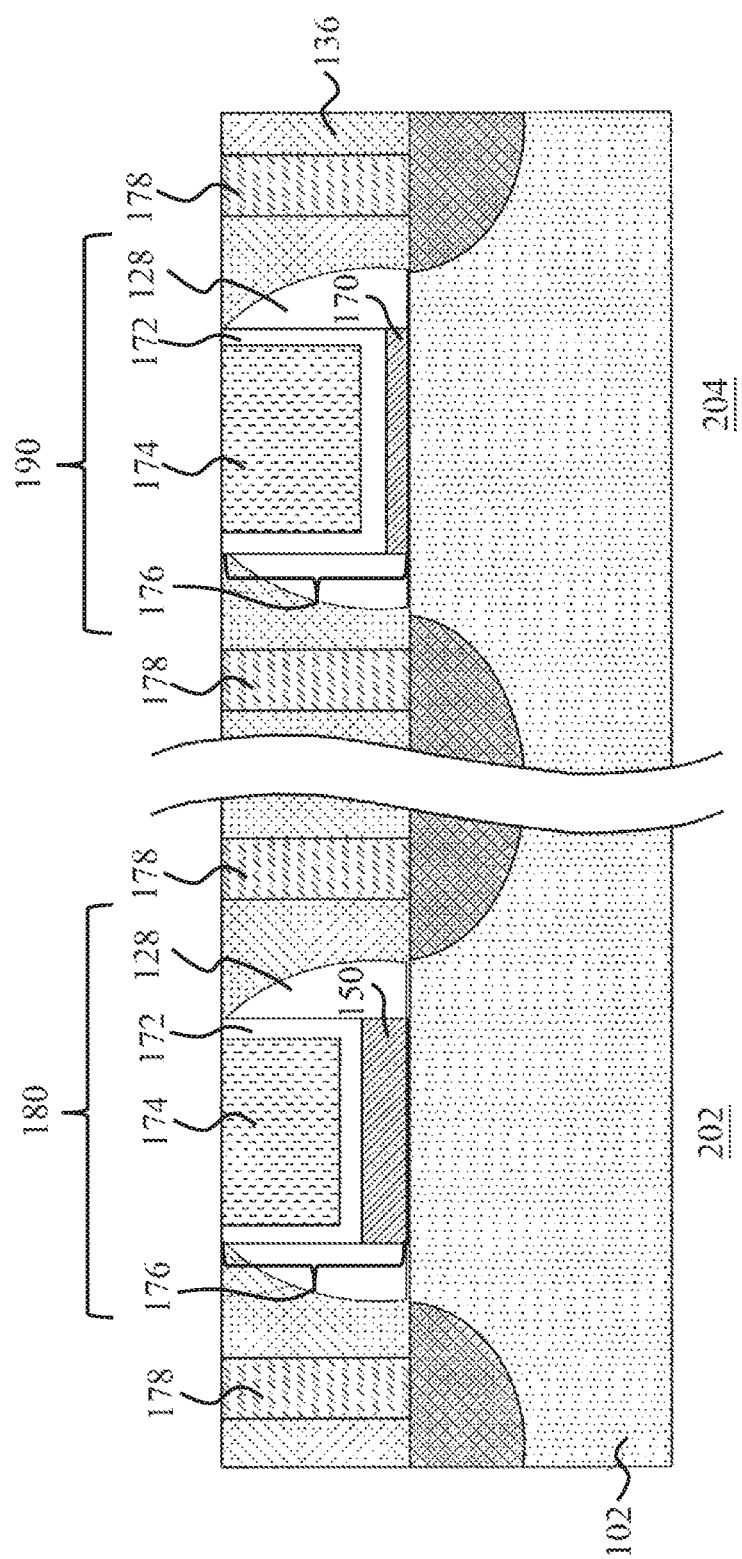

In FIGS. 17A through 17C, an oxidation is performed to form a second conformal gate oxide 170 on channel regions 118 in low-voltage region 204. Gate oxide 170 may be formed using a similar oxidation process used to form gate oxide 150. Thus, nitride layer 152 may be consumed during the oxidation, and in the resulting structure gate oxide 170 may include a semiconductor oxynitride layer over a semiconductor oxide layer (not explicitly illustrated). In various embodiments, gate oxide 170 is thinner than gate oxide 150. Thus, the oxidation process for gate oxide 170 may not affect the thickness of gate oxide 150 because the oxidation process may be completed before reaching the underlying semiconductor material of fins 108 in high-voltage region 202. In such embodiments, gate oxide 150 acts like a mask during the formation of gate oxide 170.

Furthermore, the resulting gate oxide 170 may have a thickness T5 on a bottom edge of channel region 118, a thickness T6 on a sidewall of channel region 118, and a thickness T7 on a top surface of channel region 118. As mentioned above, thicknesses T5, T6, and T7 may not be exactly equal due to the different crystalline orientations of the semiconductor material of fins 108. For example, thickness T5 at a bottom portion of channel regions 118 may be less than thicknesses T6 and T7 on sidewalls and a top surface of channel regions 118. As further discussed above, gate oxide 170 may be thinner and more uniform than gate oxide 150 to achieve a desired reliability for the lower-operating voltage devices of low voltage region 204. For example, in embodiments when the operating voltage of devices in low-voltage region 204 is about 0.9V, thicknesses T5, T6, and T7 may be between about 12 Å to about 10 Å with a difference between a thickest point (e.g., thickness T6 or T7) and a thinnest point (e.g., thickness T5) of gate oxide 170 may be less than about 2 Å. As another example, in embodiments when the operating voltage of devices in low-voltage region 204 is about 0.75V, thicknesses T5, T6, and T7 may be between about 10 Å (or even less) with a difference between a thickest point (e.g., thickness T6 or T7)

and a thinnest point (e.g., thickness T5) of gate oxide 170 may be less than about 2 Å. Thus, gate oxides of varying thicknesses and uniformity may be formed in different regions of a wafer depending on desired operating voltages of devices in such regions.

Next, referring to FIGS. 18A through 18B, remaining portions of gate stack 176 is formed in trenches 140 (e.g., between gate spacers 128). For example, a high-k dielectric liner 172 is formed as a conformal layer in trenches 140. High-k dielectric liner 172 may cover top surfaces and the sidewalls of gate oxides 150 or 170 (see FIG. 17A). In accordance with some embodiments, high-k dielectric liner 172 includes a high-k dielectric material having k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of high-k dielectric liner 172 may include molecular beam deposition (MBD), ALD, plasma enhanced CVD (PECVD), or the like.

Next, a conductive gate electrode 174 is formed over high-k dielectric liner 172 by 174 remaining portions of trench 140 with a conductive material. Gate electrode 172 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. The formation of high-k dielectric liner 172 and gate electrode 174 may overflow trench 140 and cover a top surface of ILD 136. Subsequently, a planarization (e.g., a CMP) is performed to remove the excess portions of high-k dielectric liner 172 and gate electrode 174. The resulting remaining portions of gate oxide 150 or 170, high-k dielectric liner 172, and gate electrode 174 forms a gate stack 176 over a channel region 118 of the resulting finFET 180 in high-voltage region 202 and finFET 180 in low-voltage region 204. Additional features, such as source/drain contacts 178, for example, comprising nickel (Ni), tungsten (W), or the like may then be formed in ILD 136 using any suitable process to electrically connect with source/drain regions 134.

FIG. 19 illustrates an example process flow 300 for forming semiconductor devices (e.g., finFETs) in accordance with some embodiments. In step 302, a semiconductor fin (e.g., fin 108) is formed extending upwards from a substrate (e.g., substrate 102). The fin includes a channel region (e.g., channel region 118) of a finFET (e.g., finFETs 180 or 190). In step 304, a maximum thickness variation for a gate oxide (e.g., gate oxide 150 or 170) is selected in accordance with an operating voltage of the finFET. For example, higher operating voltage finFETs may have a higher maximum thickness variation compared to lower operating voltage finFETs. In some embodiments, the thickness of the gate oxide may also be selected in accordance with the operating voltage of the finFET. In step 306, the gate oxide is formed on the channel region. A thickness variation of the gate oxide (e.g., a difference in thicknesses between a thickest point and a thinnest point of the gate oxide) may be less than the maximum thickness variation selected in step 304. Additional finFETs may also be formed, wherein each additional finFET's gate oxide variation and/or thickness may be selected based on a corresponding operating voltage. For example, if another finFET has a lower operating voltage, the gate oxide of the other finFET may be thinner and have a lower maximum thickness variation.

Various embodiments include forming conformal gate oxides over channel regions of finFETS. The operating voltage of finFETs in the die may vary. For example, the die may include high-voltage regions (e.g., for input/output finFETs) and low-voltage regions (e.g., core finFETs). The thickness and uniformity of the gate oxides of each finFET may be selected in accordance with the finFET's operating voltage. The formation of such gate oxides may include a surface nitridation process in combination with a suitable oxidation, which may improve the conformity of the gate oxides.

In accordance with an embodiment, a fin field-effect-transistor (finFET) includes a semiconductor fin comprising a channel region and a gate oxide on a sidewall and a top surface of the channel region. The gate oxide includes a thinnest portion having a first thickness and a thickest portion having a second thickness different than the first thickness. A difference between the first thickness and the second thickness is less than a maximum thickness variation, and the maximum thickness variation is in accordance with an operating voltage of the finFET.

In accordance with another embodiment, a semiconductor device includes a first finFET having a first operating voltage and a second finFET having a second operating voltage less than the first operating voltage. The first finFET includes a first channel region and a first gate oxide on the first channel region. The first gate oxide has a first thickness variation between a first thickest portion of the first gate oxide and a first thinnest portion of the first gate oxide. The second finFET includes a second channel region and a second gate oxide on the second channel region. The second gate oxide has a second thickness variation between a second thickest portion of the second gate oxide and a second thinnest portion of the second gate oxide. The second thickness variation is less than the first thickness variation.

In accordance with yet another embodiment, a semiconductor device includes a first fin field effect transistor (finFET) and a second finFET. The first finFET includes a first fin extending upwards from a semiconductor substrate, a first gate dielectric over and along sidewalls of the first fin, and a first gate electrode over the first gate dielectric. The first gate dielectric has a first average thickness. The second finFET includes a second fin extending upwards from the semiconductor substrate, a second gate dielectric over and along sidewalls of the second fin, and a second gate electrode over the second gate dielectric. The second gate dielectric has a second average thickness greater than the first average thickness, and a second operating voltage of the second finFET is greater than a first operating voltage of the first finFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a first fin field effect transistor (finFET) having a first operating voltage, the first finFET comprising:
      a first channel region; and
      a first gate oxide on the first channel region, wherein the first gate oxide has a first thickness variation between a first thickest portion of the first gate oxide and a first thinnest portion of the first gate oxide; and a second finFET having a second operating voltage, wherein the second operating voltage is less than the first operating voltage, and wherein the second finFET comprises:

a second channel region; and a second gate oxide on the second channel region, wherein the second gate oxide has a second thickness variation between a second thickest portion of the second gate oxide and a second thinnest portion of the second gate oxide, and wherein the second thickness variation is less than the first thickness variation.

2. The semiconductor device of claim 1, wherein the first gate oxide is thicker than the second gate oxide.

3. The semiconductor device of claim 1, wherein the first thickness variation is in accordance with the first operating voltage, and wherein the second thickness variation is in accordance with the second operating voltage.

4. The semiconductor device of claim 1, wherein a first thickness of the first gate oxide is in accordance with the first operating voltage, and wherein a second thickness of the second gate oxide is in accordance with the second operating voltage.

5. The semiconductor device of claim 1, wherein the first gate oxide comprises a semiconductor oxynitride layer over a semiconductor oxide layer.

6. The semiconductor device of claim 1, wherein the first thickness variation is less than about 7 Angstroms (Å) when the first operating voltage is about 1.8 volts (V), and wherein the first thickness variation is less than about 5 Å when the first operating voltage is about 1.5 V.

7. The semiconductor device of claim 1, wherein the second thickness variation is less than about 2 Angstroms (Å), and wherein the second operating voltage is less than about 0.9 volts (V).

8. A semiconductor device comprising:

a first fin field effect transistor (finFET) having a first operating voltage, the first finFET comprising:

a first channel region; and a first gate oxide on the first channel region, wherein the first gate oxide has a first thickness variation between a first thickest portion of the first gate oxide and a first thinnest portion of the first gate oxide, and wherein the first thickest portion has a first thickness and the first thinnest portion has a second thickness; and a second finFET having a second operating voltage, wherein the second operating voltage is less than the first operating voltage, and wherein the second finFET comprises:

a second channel region; and a second gate oxide on the second channel region, wherein the second gate oxide has a second thickness variation between a second thickest portion of the second gate oxide and a second thinnest portion of the second gate oxide, wherein the second thickness variation is less than the first thickness variation, wherein the second thickest portion has a third thickness, and wherein the first thickness is greater than the third thickness.

9. The semiconductor device of claim 8 wherein the first thickness and the second thickness are about 30 angstroms (Å) to about 50 Å when the first operating voltage is about 1.8 volts (V), wherein the first thickness and the second thickness are about 25 Å to about 45 Å when the first operating voltage is about 1.5V, wherein the first thickness and the second thickness are about 10 Å to about 12 Å when the first operating voltage is about 0.9V, and wherein the first thickness and the second thickness are about 10 Å when the first operating voltage is about 0.75V.

10. The semiconductor device of claim 8, wherein the first thickness variation is about 7 angstroms (Å) when the operating voltage is about 1.8 volts (V), wherein the first thickness variation is about 5 Å when the operating voltage is about 1.5V, and wherein the first thickness variation is about 2 Å when the operating voltage is less than about 0.9V.

11. The semiconductor device of claim 8, further comprising:

a high-k liner over the first gate oxide; and a conductive gate electrode over the high-k liner.

12. The semiconductor device of claim 8, wherein the first thinnest portion is lower than the first thickest portion.

13. A semiconductor device comprising:

a first fin field effect transistor (finFET) having a first operating voltage, the first finFET comprising:

a first channel region; and a first gate oxide on the first channel region, wherein the first gate oxide has a first thickness variation between a first thickest portion of the first gate oxide and a first thinnest portion of the first gate oxide, and wherein the first gate oxide has a first average thickness; and a second finFET having a second operating voltage, wherein the second operating voltage is less than the first operating voltage, and wherein the second finFET comprises:

a second channel region; and a second gate oxide on the second channel region, wherein the second gate oxide has a second thickness variation between a second thickest portion of the second gate oxide and a second thinnest portion of the second gate oxide, wherein the second thickness variation is less than the first thickness variation, and wherein the second gate oxide has a second average thickness greater than the first average thickness.

14. The semiconductor device of claim 13, wherein the first gate oxide and the second gate oxide each comprise silicon oxide.

15. The semiconductor device of claim 13, further comprising:

a first high-k dielectric liner over and along sidewalls of the first gate oxide, wherein the first high-k dielectric liner is disposed between the first gate oxide and a first gate electrode; and a second high-k dielectric liner over and along sidewalls of the second gate oxide, wherein the second high-k dielectric liner is disposed between the second gate oxide and a second gate electrode.

16. The semiconductor device of claim 15, wherein the first high-k dielectric liner comprises a same material as the second high-k dielectric liner.

17. The semiconductor device of claim 16, wherein the first and second high-k dielectric liner comprise a high k dielectric material having k value greater than 7.0.

18. The semiconductor device of claim 17, wherein the high-k dielectric material comprises a metal oxide.

19. The semiconductor device of claim 13, wherein the first average thickness is about 30 angstroms (Å) to about 50 Å when the first operating voltage is about 1.8 volts (V), wherein the first average thickness is about 25 Å to about 45 Å when the first operating voltage is about 1.5V, wherein the first average thickness is about 10 Å to about 12 Å when the first operating voltage is about 0.9V, and wherein the first average thickness is about 10 Å when the first operating voltage is about 0.75V.

20. The semiconductor device of claim 13, further comprising:
   first gate spacers disposed along sidewalls of the first gate oxide and a first gate electrode; and
   second gate spacers disposed along sidewalls of the second gate oxide and a second gate electrode.

* * * * *